United States Patent
Nakagome et al.

(10) Patent No.: US 12,301,127 B2
(45) Date of Patent: May 13, 2025

(54) SEMICONDUCTOR MODULE

(71) Applicant: FUJI ELECTRIC CO., LTD., Kawasaki (JP)

(72) Inventors: Akito Nakagome, Matsumoto (JP); Ryoichi Kato, Matsumoto (JP); Yuma Murata, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 520 days.

(21) Appl. No.: 17/731,456

(22) Filed: Apr. 28, 2022

(65) Prior Publication Data
US 2022/0407432 A1  Dec. 22, 2022

(30) Foreign Application Priority Data
Jun. 16, 2021  (JP) .................. 2021-100040

(51) Int. Cl.
*H02M 7/00* (2006.01)
*H01L 23/498* (2006.01)

(52) U.S. Cl.
CPC ...... *H02M 7/003* (2013.01); *H01L 23/49838* (2013.01); *H01L 23/49894* (2013.01)

(58) Field of Classification Search
CPC ............... H02M 7/003; H02M 7/5387; H01L 23/49838; H01L 23/49894;
(Continued)

(56) References Cited

U.S. PATENT DOCUMENTS 5,986,218 A  11/1999  Muto et al.
6,469,378 B2  10/2002  Scheuermann
(Continued)

FOREIGN PATENT DOCUMENTS

JP  9135057 A  5/1997
JP  11026691 A  1/1999
(Continued)

OTHER PUBLICATIONS

Fuji Electric Review, vol. 62, No. 4, 2016; "Power Semiconductors Contributing in Energy Management"; 255, ISSN: 0429-8284; (8 pages).
(Continued)

*Primary Examiner* — Shouxiang Hu

(57) ABSTRACT

Provided is a semiconductor module that can improve the insulation properties at terminals to which electric power is supplied. A semiconductor module includes a negative electrode terminal connected to a negative electrode side of direct current power; a positive electrode terminal disposed above the negative electrode terminal and connected to a positive electrode side of the direct current power in a state where an exposed portion of the negative electrode terminal including one end of the negative electrode terminal is exposed; an insulating sheet disposed between the negative electrode terminal and the positive electrode terminal for insulation between the negative electrode terminal and the positive electrode terminal in a state where an exposed portion of the insulating sheet is exposed between the one end of the negative electrode terminal and one end of the positive electrode terminal; and a first dielectric portion formed to cover at least a corner of the one end of the positive electrode terminal, the corner being in contact with the insulating sheet.

9 Claims, 8 Drawing Sheets

(58) Field of Classification Search
CPC ........... H01L 23/49844; H01L 23/5386; H01L 25/072; H01L 23/48
See application file for complete search history.

(56) References Cited

U.S. PATENT DOCUMENTS

| | | | | |
|---|---|---|---|---|
| 6,504,110 | B1* | 1/2003 | Kusukawa | ........... H05K 1/0257 |
| | | | | 257/692 |
| 6,843,335 | B2 | 1/2005 | Shirakawa et al. | |
| 7,777,433 | B2 | 8/2010 | Yamaguchi et al. | |
| 8,054,633 | B2 | 11/2011 | Suwa et al. | |
| 8,853,559 | B2 | 10/2014 | Matsumoto et al. | |
| 9,818,687 | B2 | 11/2017 | Kanai | |
| 9,972,559 | B2* | 5/2018 | Park | ...................... H02M 7/003 |
| 11,348,855 | B2* | 5/2022 | Satou | ........................ B60L 9/18 |
| 2002/0125563 | A1 | 9/2002 | Scheuermann | |
| 2002/0195286 | A1 | 12/2002 | Shirakawa et al. | |
| 2006/0086981 | A1 | 4/2006 | Yamaguchi et al. | |
| 2009/0002956 | A1 | 1/2009 | Suwa et al. | |
| 2012/0012768 | A1 | 5/2012 | Matsumoto et al. | |
| 2017/0025344 | A1 | 1/2017 | Kanai | |
| 2020/0157308 | A1 | 5/2020 | Oishi | |
| 2020/0381343 | A1* | 12/2020 | Miyachi | ............ H01L 23/49524 |

FOREIGN PATENT DOCUMENTS

| | | |
|---|---|---|
| JP | 2001057409 A | 2/2001 |
| JP | 2002076197 A | 3/2002 |
| JP | 2002-270730 A | 9/2002 |
| JP | 2003-009546 A | 1/2003 |
| JP | 2006121834 A | 5/2006 |
| JP | 2007234694 A | 9/2007 |
| JP | 2009-5512 A | 1/2009 |
| JP | 2012009815 A | 1/2012 |
| JP | 2013-110216 A | 6/2013 |
| JP | 2015-053322 A | 3/2015 |
| JP | 2016192497 A | 11/2016 |
| JP | 2017028132 A | 2/2017 |
| JP | 2019197816 A | 11/2019 |
| WO | 2011040054 A1 | 4/2011 |
| WO | 2018193705 A1 | 10/2018 |

OTHER PUBLICATIONS

Japanese Office Action issued in Japanese Application No. 2021-100040 dated Feb. 12, 2025.

* cited by examiner

SEMICONDUCTOR MODULE

This application is based upon and claims the benefit of priority from the prior Japanese Patent Application No. 2021-100040 filed on Jun. 16, 2021, the entire contents of which are incorporated herein by reference.

TECHNICAL FIELD

The present invention relates to a semiconductor module applied to a power conversion device or the like.

BACKGROUND ART

In recent years, the development and spread of hybrid vehicles and electric vehicles using electric power as a power source have been accelerated in the automotive industry due to the promotion of energy conservation and the strengthening of emission control of carbon dioxide ($CO_2$). An inverter for use in power control of the hybrid vehicle or the electric vehicle is mounted in a limited space and there is a need for reduction in weight and improvement in efficiency taking into account low fuel consumption. Further, there is required a power semiconductor module matching the outputs of a battery and a motor.

A power semiconductor module has a laminated wiring structure from inside to outside and includes a positive electrode terminal and a negative electrode terminal (PN terminals) for external input and an insulating paper sandwiched between the PN terminals. Further, the power semiconductor module has a shape such that the PN terminals having such a structure are insert-molded with a polyphenylene sulfide (PPS) resin.

PTL 1 discloses a semiconductor device including front-side conductor plates selectively disposed on an insulating substrate, semiconductor chips disposed on the front-side conductor plates, a solid insulator disposed on the insulating substrate, a case provided to surround the insulating substrate, and a flexible insulator filled in the case. In the semiconductor device disclosed in PTL 1, the solid insulator has a thermal expansion coefficient having a value that is intermediate between those of the front-side conductor plates and the insulating substrate.

PTL 2 discloses that a conductor layer provided on a surface of an insulating sheet on the side where a second metal member is provided has at least a portion provided to extend toward the outer peripheral edge of the insulating sheet from a point where a line formed by extending the outer peripheral edge of the second metal member in the laminating direction crosses the surface of the insulating sheet, and further, the outer peripheral edge of the conductor layer is located inward of the outer peripheral edge of insulating sheet, so that the potential difference between the second metal member and the insulating sheet is reduced, resulting in that the electric field strength is suppressed to be low in a region where the insulating sheet, the second metal member, and a sealing resin are in contact with each other.

CITATION LIST

Patent Literature

PTL 1: JP 2002-76197 A
PTL 2: JP 2016-192497 A

SUMMARY OF INVENTION

Technical Problem

In the technical field of semiconductor modules, generally, the insulation distance is set pursuant to the International Electrotechnical Commission (IEC) Standard for ensuring the insulation performance. However, there is a problem that, depending on the shapes of PN terminals provided in a semiconductor module, when an unwanted edge occurs on the PN terminals in the manufacturing process, the reliability of the insulation of the PN terminals is reduced.

It is an object of the present invention to provide a semiconductor module that can improve the insulation properties at terminals to which electric power is supplied.

Solution to Problem

In order to achieve the object described above, a semiconductor module according to an aspect of the present invention includes: a first power supply terminal connected to a first polarity side of direct current power; a second power supply terminal disposed above the first power supply terminal and connected to a second polarity side of the direct current power in a state where a part of the first power supply terminal including one end of the first power supply terminal is exposed; an insulating sheet disposed between the first power supply terminal and the second power supply terminal for insulation between the first power supply terminal and the second power supply terminal in a state where a part of the insulating sheet is exposed between the one end of the first power supply terminal and one end of the second power supply terminal; and a first dielectric portion formed to cover at least a corner of the one end of the second power supply terminal, the corner being in contact with the insulating sheet.

Advantageous Effects of Invention

According to the aspect of the present invention, it is possible to improve the insulation properties at terminals to which electric power is supplied.

DESCRIPTION OF EMBODIMENTS

Embodiments of the present invention merely exemplify devices and methods for embodying the technical idea of the present invention, and the technical idea of the present invention is not limited to materials, shapes, structures, arrangements, and so on of constituent components described below. The technical idea of the present invention can be changed in various ways within the technical scope defined by the claims.

First Embodiment

A semiconductor module according to a first embodiment of the present invention will be described with reference to FIGS. 1 to 5. First, the schematic configuration of the semiconductor module according to this embodiment will be described with reference to FIGS. 1 to 5. In this embodiment, a power conversion module capable of direct current-alternating current (DC-AC) conversion will be described as an example of the semiconductor module. In order to facilitate the understanding, the illustration of inverter circuits, wiring patterns, and so on mounted on laminated substrates provided in the semiconductor module according to this embodiment is omitted in FIG. 1.

Figure 1:
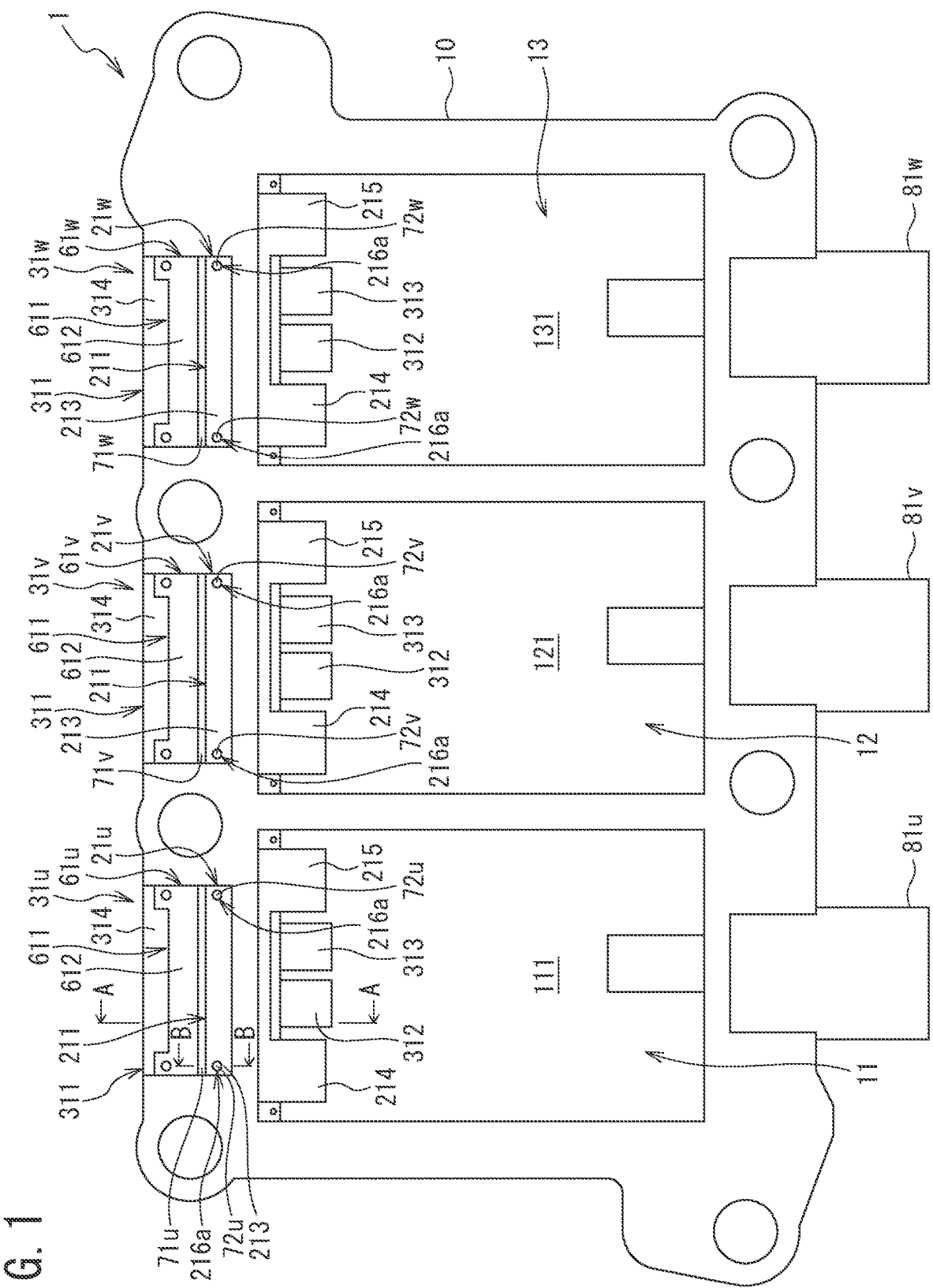
FIG. 1 is a plan view illustrating a schematic configuration of a semiconductor module according to a first embodiment of the present invention.

As illustrated in FIG. 1, a semiconductor module 1 according to this embodiment includes a case 10 having a rectangular shape in plan view. The case 10 includes a housing portion 11 that houses a U-phase inverter portion, a housing portion 12 that houses a V-phase inverter portion, and a housing portion 13 that houses a W-phase inverter portion. The semiconductor module 1 includes a U-phase laminated substrate 111 housed in the housing portion 11, and a U-phase inverter circuit (not illustrated in FIG. 1, see FIG. 2) mounted on the laminated substrate 111. The semiconductor module 1 includes a V-phase laminated substrate 121 housed in the housing portion 12, and a V-phase inverter circuit (not illustrated in FIG. 1, see FIG. 2) mounted on the laminated substrate 121. The semiconductor module 1 includes a W-phase laminated substrate 131 housed in the housing portion 13, and a W-phase inverter circuit (not illustrated in FIG. 1, see FIG. 2) mounted on the laminated substrate 131.

The case 10 is disposed to surround semiconductor elements (details will be described later), the laminated substrates 111, 121, 131, a plurality of wiring patterns (details will be described later), and a plurality of connecting members (details will be described later) on the inner side of the case 10. The case 10 is placed on a heat dissipation base or a cooler (neither illustrated) and mechanically fixed to the heat dissipation base or the cooler by a case joining material (not illustrated). With this configuration, the case 10 is able to dissipate the heat generated by the semiconductor elements to the outside of the case 10.

The semiconductor module 1 includes a U-phase negative electrode terminal 31u (one example of a first power supply terminal) connected to a first polarity side of DC power. Further, the semiconductor module 1 includes a positive electrode terminal 21u (one example of a second power supply terminal) disposed above the negative electrode terminal 31u and connected to a second polarity side of the DC power in a state where an exposed portion 314 of the negative electrode terminal 31u (one example of a part of the first power supply terminal) including one end 311 of the negative electrode terminal 31u is exposed. In this embodiment, the first polarity side connected to the negative electrode terminal 31u is the negative electrode side of the DC power, and the second polarity side connected to the positive electrode terminal 21u is the positive electrode side of the DC power. The negative electrode terminal 31u and the positive electrode terminal 21u are provided on one of both sides of the housing portion 11 at one end portion of the case 10 on the longitudinal side thereof. Further, the semiconductor module 1 includes an output terminal 81u from which U-phase AC power is output. The output terminal 81u is provided on the other of both sides of the housing portion 11 at the other end portion of the case 10 on the longitudinal side thereof. The positive electrode terminal 21u and the negative electrode terminal 31u are disposed to face the output terminal 81u with the housing portion 11 interposed therebetween.

Further, the semiconductor module 1 includes an insulating sheet 61u disposed between the negative electrode terminal 31u and the positive electrode terminal 21u for insulation between the negative electrode terminal 31u and the positive electrode terminal 21u in a state where an exposed portion 612 of the insulating sheet 61u (one example of a part of the insulating sheet) is exposed between the one end 311 of the negative electrode terminal 31u and one end 211 of the positive electrode terminal 21u. Further, the semiconductor module 1 includes a first dielectric portion 71u formed to cover at least a corner 212 (not illustrated in FIG. 1, see FIG. 4) of the one end 211 of the positive electrode terminal 21u, the corner 212 being in contact with the insulating sheet 61u.

The semiconductor module 1 includes a V-phase negative electrode terminal 31v (one example of a first power supply terminal) connected to a first polarity side of DC power. Further, the semiconductor module 1 includes a positive electrode terminal 21v (one example of a second power supply terminal) disposed above the negative electrode terminal 31v and connected to a second polarity side of the DC power in a state where an exposed portion 314 of the negative electrode terminal 31v (one example of a part of the first power supply terminal) including one end 311 of the negative electrode terminal 31v is exposed. In this embodiment, the first polarity side connected to the negative electrode terminal 31v is the negative electrode side of the DC power, and the second polarity side connected to the positive electrode terminal 21v is the positive electrode side of the DC power. The negative electrode terminal 31v and the positive electrode terminal 21v are provided on one of both sides of the housing portion 12 at one end portion of the case 10 on the longitudinal side thereof. Further, the semiconductor module 1 includes an output terminal 81v from which V-phase AC power is output. The output terminal 81v is provided on the other of both sides of the housing portion 12 at the other end portion of the case 10 on the longitudinal side thereof. The positive electrode terminal 21v and the negative electrode terminal 31v are disposed to face the output terminal 81v with the housing portion 12 interposed therebetween.

Further, the semiconductor module 1 includes an insulating sheet 61v disposed between the negative electrode terminal 31v and the positive electrode terminal 21v for insulation between the negative electrode terminal 31v and the positive electrode terminal 21v in a state where an exposed portion 612 of the insulating sheet 61v (one example of a part of the insulating sheet) is exposed between the one end 311 of the negative electrode terminal 31v and one end 211 of the positive electrode terminal 21v. Further, the semiconductor module 1 includes a first dielectric portion 71v formed to cover at least a corner (not illustrated) of the one end 211 of the positive electrode terminal 21v, the corner being in contact with the insulating sheet 61v. The corner of the one end 211 of the positive electrode terminal 21v corresponds to the corner 212 in the positive electrode terminal 21u.

The semiconductor module 1 includes a W-phase negative electrode terminal 31w (one example of a first power supply terminal) connected to a first polarity side of DC power. Further, the semiconductor module 1 includes a positive electrode terminal 21w (one example of a second power supply terminal) disposed above the negative electrode terminal 31w and connected to a second polarity side of the DC power in a state where an exposed portion 314 of the negative electrode terminal 31w (one example of a part of the first power supply terminal) including one end 311 of the negative electrode terminal 31w is exposed. In this embodiment, the first polarity side connected to the negative electrode terminal 31w is the negative electrode side of the DC power, and the second polarity side connected to the positive electrode terminal 21w is the positive electrode side of the DC power. The negative electrode terminal 31w and the positive electrode terminal 21w are provided on one of both sides of the housing portion 13 at one end portion of the case 10 on the longitudinal side thereof. Further, the semiconductor module 1 includes an output terminal 81w from which W-phase AC power is output. The output terminal 81w is provided on the other of both sides of the housing portion 13 at the other end portion of the case 10 on the longitudinal side thereof. The positive electrode terminal 21w and the negative electrode terminal 31w are disposed to face the output terminal 81w with the housing portion 13 interposed therebetween.

Further, the semiconductor module 1 includes an insulating sheet 61w disposed between the negative electrode terminal 31w and the positive electrode terminal 21w for insulation between the negative electrode terminal 31w and the positive electrode terminal 21w in a state where an exposed portion 612 of the insulating sheet 61w (one example of a part of the insulating sheet) is exposed between the one end 311 of the negative electrode terminal 31w and one end 211 of the positive electrode terminal 21w. Further, the semiconductor module 1 includes a first dielectric portion 71w formed to cover at least a corner (not illustrated) of the one end 211 of the positive electrode terminal 21w, the corner being in contact with the insulating sheet 61w. The corner of the one end 211 of the positive electrode terminal 21w corresponds to the corner 212 in the positive electrode terminal 21u.

The case 10 is formed by insert molding such that a heated and melted thermoplastic resin is injected into an injection mold in which the positive electrode terminals 21u, 21v, 21w, the insulating sheets 61u, 61v, 61w, and the negative electrode terminals 31u, 31v, 31w are inserted, thereby integrating the inserted positive electrode terminals 21u, 21v, 21w, insulating sheets 61u, 61v, 61w, and negative electrode terminals 31u, 31v, 31w with the injected resin. As the thermoplastic resin, a polyphenylene sulfide (PPS) resin, a polybutylene terephthalate (PBT) resin, a polybutylene succinate (PBS) resin, a polyamide (PA) resin, an acrylonitrile butadiene styrene (ABS) resin, or the like may be used, for example. The first dielectric portions 71u, 71v, 71w are formed in such a way that, after forming the case 10, a liquid in which a dielectric material having a predetermined relative permittivity is dispersed in a resin is applied to predetermined portions by a dispenser or spin coating, for example. As the dielectric material, titanium oxide or a titanate-based material may be used. As a specific titanate-based material, one or more of barium titanate, strontium titanate, calcium titanate, and magnesium titanate may be selected and used.

Next, the circuit configurations of inverter circuits 112, 122, 132 provided in the semiconductor module 1 will be described with reference to FIG. 2. Since the inverter circuits 112, 122, 132 have the same configuration, the circuit configurations of the inverter circuits 112, 122, 132 will be described using the inverter circuit 112 as an example.

Figure 2:
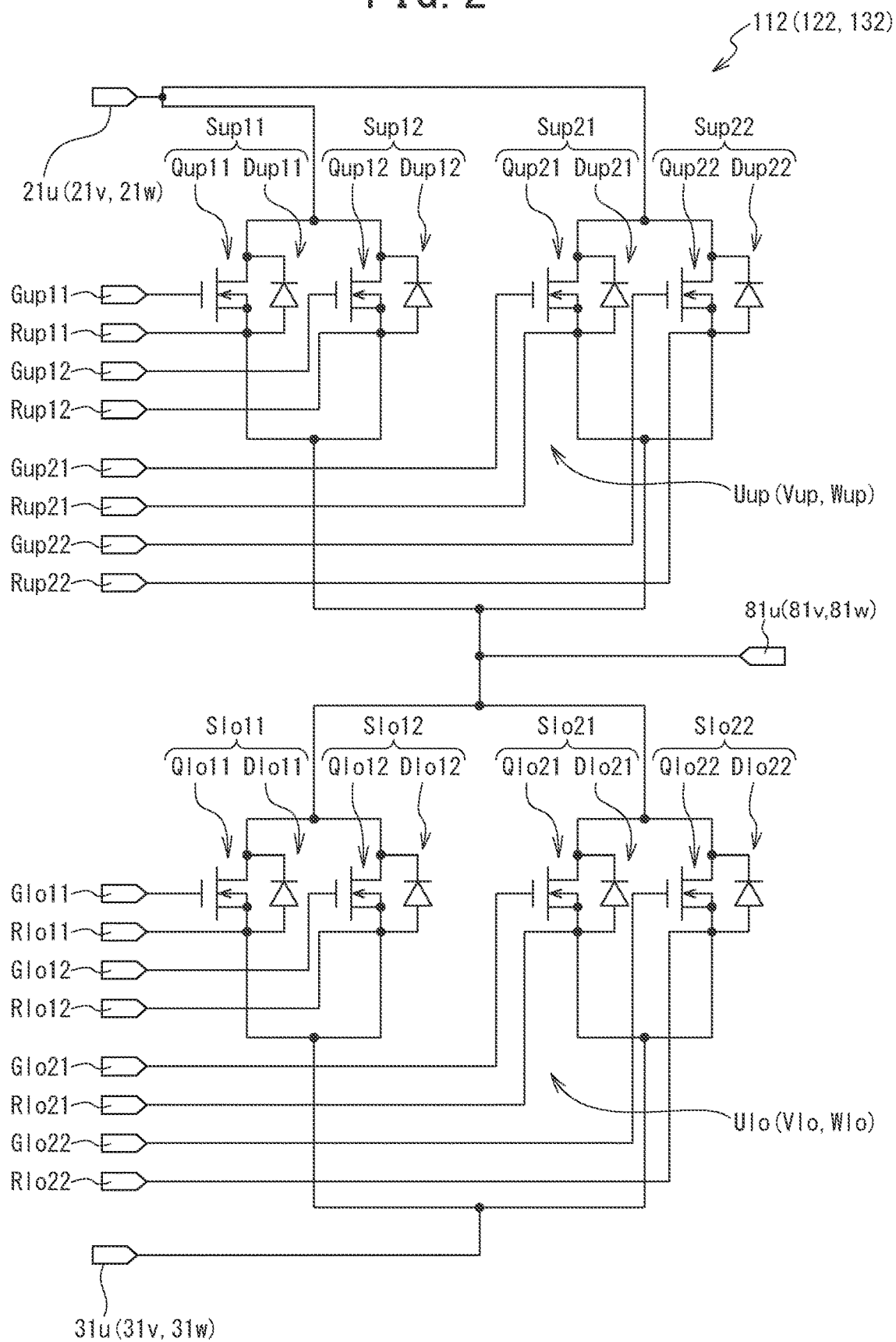
FIG. 2 is a circuit diagram illustrating an example of an inverter circuit provided in the semiconductor module according to the first embodiment of the present invention.

As illustrated in FIG. 2, the inverter circuit 112 provided in the semiconductor module 1 includes a plurality of semiconductor elements Sup11, Sup12, Sup21, Sup22 and a plurality of semiconductor elements Slo11, Slo12, Slo21, Slo22 that are connected in series between the negative electrode terminal 31u and the positive electrode terminal 21u. In the inverter circuit 112, the semiconductor elements Sup11, Sup12, Sup21, Sup22 are connected in parallel, and the semiconductor elements Slo11, Slo12, Slo21, Slo22 are connected in parallel. The semiconductor elements Sup11, Sup12, Sup21, Sup22 connected in parallel and the semiconductor elements Slo11, Slo12, Slo21, Slo22 connected in parallel are connected in series between the negative electrode terminal 31u and the positive electrode terminal 21u. In the inverter circuit 112, a connecting portion between the semiconductor elements Sup11, Sup12, Sup21, Sup22 connected in parallel and the semiconductor elements Slo11, Slo12, Slo21, Slo22 connected in parallel is connected to the output terminal 81u from which U-phase AC power is output. That is, in the inverter circuit 112, the semiconductor elements Sup11, Sup12, Sup21, Sup22 form an upper arm Uup of U-phase AC power, and the semiconductor elements Slo11, Slo12, Slo21, Slo22 form a lower arm Ulo of U-phase AC power.

The inverter circuit 122 provided in the semiconductor module 1 has the same configuration as the inverter circuit 112 when the negative electrode terminal 31u is read as the negative electrode terminal 31v, the positive electrode terminal 21u is read as the positive electrode terminal 21v, and the output terminal 81u is read as the output terminal 81v. In the inverter circuit 122, semiconductor elements Sup11, Sup12, Sup21, Sup22 form an upper arm Vup of V-phase AC power, and semiconductor elements Slo11, Slo12, Slo21, Slo22 form a lower arm Vlo of V-phase AC power.

The inverter circuit 132 provided in the semiconductor module 1 has the same configuration as the inverter circuit 112 when the negative electrode terminal 31u is read as the negative electrode terminal 31w, the positive electrode terminal 21u is read as the positive electrode terminal 21w, and the output terminal 81u is read as the output terminal 81w. In the inverter circuit 132, semiconductor elements Sup11, Sup12, Sup21, Sup22 form an upper arm Wup of W-phase AC power, and semiconductor elements Slo11, Slo12, Slo21, Slo22 form a lower arm Wlo of W-phase AC power.

An object to be driven by the semiconductor module 1, such as, for example, a motor (not illustrated), is connected to the output terminal 81*u*, the output terminal 81*v*, and the output terminal 81*w*. With this configuration, the semiconductor module 1 is able to supply to the motor U-phase AC power via the output terminal 81*u* of the inverter circuit 112, V-phase AC power via the output terminal 81*v* of the inverter circuit 122, and W-phase AC power via the output terminal 81*w* of the inverter circuit 132.

As illustrated in FIG. 2, the semiconductor element Sup11 has a transistor Qup11 being, for example, an n-type MOSFET and a free-wheeling diode Dup11 connected in antiparallel to the transistor Qup11. The transistor Qup11 and the free-wheeling diode Dup11 are formed in one semiconductor substrate to be integrated into one chip, for example.

The semiconductor element Sup12 has a transistor Qup12 being, for example, an n-type MOSFET and a free-wheeling diode Dup12 connected in antiparallel to the transistor Qup12. The transistor Qup12 and the free-wheeling diode Dup12 are formed in one semiconductor substrate to be integrated into one chip, for example.

The semiconductor element Sup21 has a transistor Qup21 being, for example, an n-type MOSFET and a free-wheeling diode Dup21 connected in antiparallel to the transistor Qup21. The transistor Qup21 and the free-wheeling diode Dup21 are formed in one semiconductor substrate to be integrated into one chip, for example.

The semiconductor element Sup22 has a transistor Qup22 being, for example, an n-type MOSFET and a free-wheeling diode Dup22 connected in antiparallel to the transistor Qup22. The transistor Qup22 and the free-wheeling diode Dup22 are formed in one semiconductor substrate to be integrated into one chip, for example.

The semiconductor element Slo11 has a transistor Qlo11 being, for example, an n-type MOSFET and a free-wheeling diode Dlo11 connected in antiparallel to the transistor Qlo11. The transistor Qlo11 and the free-wheeling diode Dlo11 are formed in one semiconductor substrate to be integrated into one chip, for example.

The semiconductor element Slo12 has a transistor Qlo12 being, for example, an n-type MOSFET and a free-wheeling diode Dlo12 connected in antiparallel to the transistor Qlo12. The transistor Qlo12 and the free-wheeling diode Dlo12 are formed in one semiconductor substrate to be integrated into one chip, for example.

The semiconductor element Slo21 has a transistor Qlo21 being, for example, an n-type MOSFET and a free-wheeling diode Dlo21 connected in antiparallel to the transistor Qlo21. The transistor Qlo21 and the free-wheeling diode Dlo21 are formed in one semiconductor substrate to be integrated into one chip, for example.

The semiconductor element Slo22 has a transistor Qlo22 being, for example, an n-type MOSFET and a free-wheeling diode Dlo22 connected in antiparallel to the transistor Qlo22. The transistor Qlo22 and the free-wheeling diode Dlo22 are formed in one semiconductor substrate to be integrated into one chip, for example.

The transistors Qup11, Qup12, Qup21, Qup22 and the transistors Qlo11, Qlo12, Qlo21, Qlo22 are each, for example, a wide bandgap semiconductor element containing SiC, GaN, diamond, a gallium nitride-based material, a gallium oxide-based material, AlN, AlGaN, ZnO, or the like.

A gate of the transistor Qup11 is connected to a gate signal input terminal Gup11. A reference signal input terminal Rup11 is connected to a source of the transistor Qup11. A gate of the transistor Qup12 is connected to a gate signal input terminal Gup12. A reference signal input terminal Rup12 is connected to a source of the transistor Qup12. A gate of the transistor Qup21 is connected to a gate signal input terminal Gup21. A reference signal input terminal Rup21 is connected to a source of the transistor Qup21. A gate of the transistor Qup22 is connected to a gate signal input terminal Gup22. A reference signal input terminal Rup22 is connected to a source of the transistor Qup22.

A gate of the transistor Qlo11 is connected to a gate signal input terminal Glo11. A reference signal input terminal Rlo11 is connected to a source of the transistor Qlo11. A gate of the transistor Qlo12 is connected to a gate signal input terminal Glo12. A reference signal input terminal Rlo12 is connected to a source of the transistor Qlo12. A gate of the transistor Qlo21 is connected to a gate signal input terminal Glo21. A reference signal input terminal Rlo21 is connected to a source of the transistor Qlo21. A gate of the transistor Qlo22 is connected to a gate signal input terminal Glo22. A reference signal input terminal Rlo22 is connected to a source of the transistor Qlo22.

The gate signal input terminals Gup11, Gup12, Gup21, Gup22, the reference signal input terminals Rup11, Rup12, Rup21, Rup22, the gate signal input terminals Glo11, Glo12, Glo21, Glo22, and the reference signal input terminals Rlo11, Rlo12, Rlo21, Rlo22 are respectively connected to a control circuit (not illustrated) that controls the inverter circuits 112, 122, 132. The control circuit modulates a command value and a reference waveform to generate gate pulse signals respectively for the semiconductor elements Sup11, Sup12, Sup21, Sup22 and the semiconductor elements Slo11, Slo12, Slo21, Slo22.

The gate pulse signals are respectively applied between the gate signal input terminal Gup11 and the reference signal input terminal Rup11, between the gate signal input terminal Gup12 and the reference signal input terminal Rup12, between the gate signal input terminal Gup21 and the reference signal input terminal Rup21, and between the gate signal input terminal Gup22 and the reference signal input terminal Rup22. Therefore, the gate pulse signals are respectively applied to the transistors Qup11, Qup12, Qup21, Qup22 as gate-source voltages.

Further, the gate pulse signals are respectively applied between the gate signal input terminal Glo11 and the reference signal input terminal Rlo11, between the gate signal input terminal Glo12 and the reference signal input terminal Rlo12, between the gate signal input terminal Glo21 and the reference signal input terminal Rlo21, and between the gate signal input terminal Glo22 and the reference signal input terminal Rlo22. Therefore, the gate pulse signals are respectively applied to the transistors Qlo11, Qlo12, Qlo21, Qlo22 as gate-source voltages.

The transistors Qup11, Qup12, Qup21, Qup22 and the transistors Qlo11, Qlo12, Qlo21, Qlo22 are each turned on when the voltage level of the gate pulse signal is high level, and turned off when the voltage level of the gate pulse signal is low level, for example. Although detailed description is omitted, the transistors Qup11, Qup12, Qup21, Qup22 and the transistors Qlo11, Qlo12, Qlo21, Qlo22 provided in the inverter circuits 112, 122, 132 repeat turning on and off at predetermined timings and combinations. Consequently, the semiconductor module 1 is able to supply U-phase AC power, V-phase AC power, and W-phase AC power with a predetermined phase difference from each other to the motor from the output terminals 81*u*, 81*v*, 81*w* of the inverter circuits 112, 122, 132.

Next, the laminated substrates 111, 121, 131 will be described using FIG. 3 while referring to FIGS. 1 and 2. The laminated substrates 111, 121, 131 have the same configuration as each other. Therefore, the laminated substrates 111, 121, 131 will be described below using the laminated substrate 111 as an example.

Figure 3:
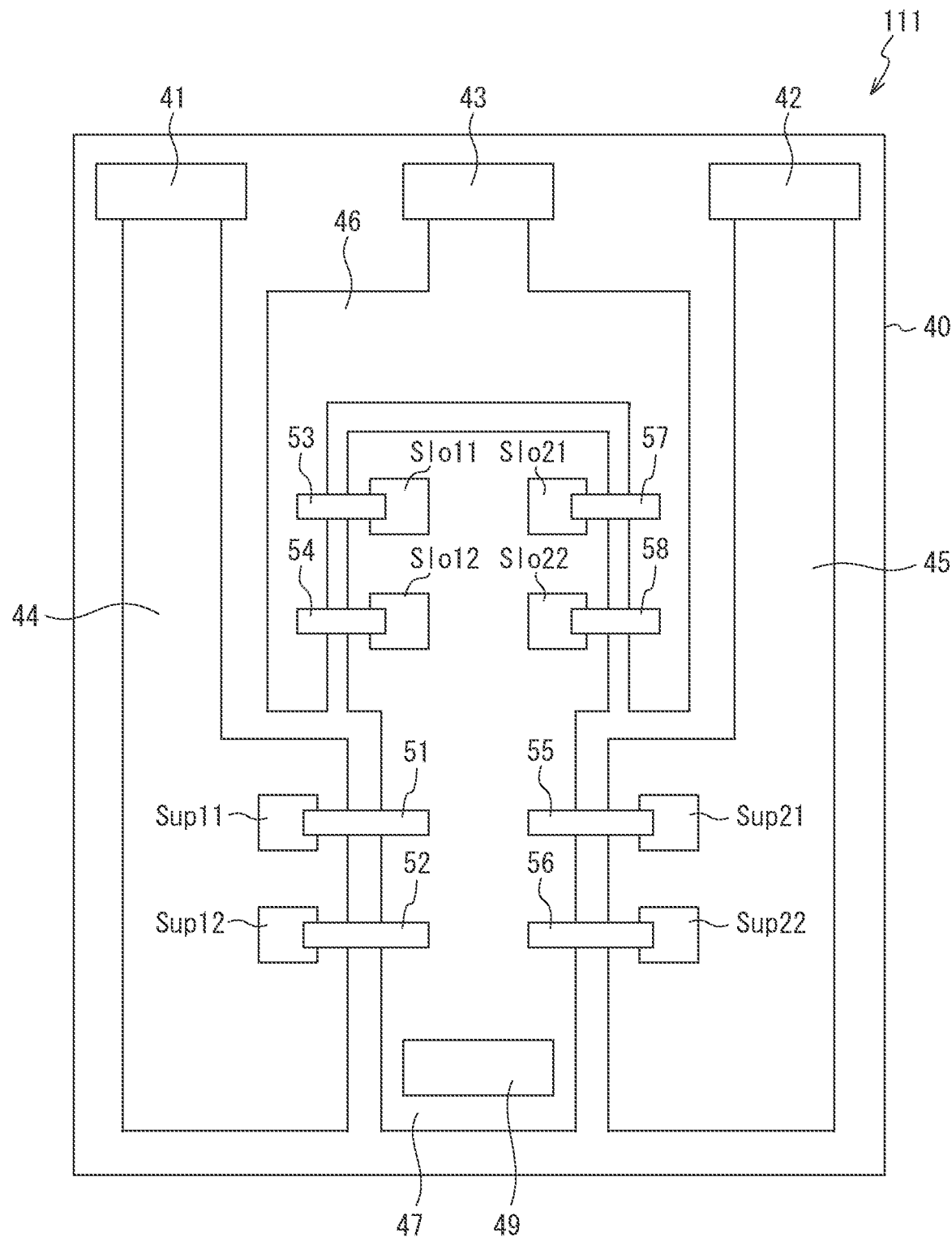
FIG. 3 is a diagram illustrating an example of a wiring pattern formed in a laminated substrate provided in the semiconductor module according to the first embodiment of the present invention.

As illustrated in FIG. 3, the laminated substrate 111 has a rectangular insulating substrate 40 and a heat dissipation pattern layer (not illustrated) of a predetermined shape formed on a lower surface of the insulating substrate 40. The laminated substrate 111 has positive electrode side input terminal patterns 41, 42 and a negative electrode side input terminal pattern 43 that are formed on one of short sides of the insulating substrate 40. The negative electrode side input terminal pattern 43 is disposed between the positive electrode side input terminal pattern 41 and the positive electrode side input terminal pattern 42. The laminated substrate 111 has an output terminal pattern 49 formed on the other short side of the insulating substrate 40. The output terminal pattern 49 is disposed to face the negative electrode side input terminal pattern 43.

The laminated substrate 111 has a positive electrode portion pattern 44 formed on the insulating substrate 40 on one of long sides of the insulating substrate 40. The positive electrode portion pattern 44 is disposed to extend between the short sides of the insulating substrate 40 along the one long side of the insulating substrate 40. The positive electrode side input terminal pattern 41 is formed on one end portion of the positive electrode portion pattern 44. Consequently, the positive electrode portion pattern 44 and the positive electrode side input terminal pattern 41 are electrically connected to each other.

The laminated substrate 111 has a positive electrode portion pattern 45 formed on the insulating substrate 40 on the other long side of the insulating substrate 40. The positive electrode portion pattern 45 is disposed to extend between the short sides of the insulating substrate 40 along the other long side of the insulating substrate 40. The positive electrode side input terminal pattern 42 is formed on one end portion of the positive electrode portion pattern 45. Consequently, the positive electrode portion pattern 45 and the positive electrode side input terminal pattern 42 are electrically connected to each other.

The laminated substrate 111 has a negative electrode portion pattern 46, and the negative electrode side input terminal pattern 43 is formed on an end portion of the negative electrode portion pattern 46 on the one short side of the insulating substrate 40. The negative electrode portion pattern 46 and the negative electrode side input terminal pattern 43 are electrically connected to each other. The negative electrode portion pattern 46 is bifurcated into portions respectively extending along the positive electrode portion patterns 44, 45 on the end portion side opposite to the negative electrode side input terminal pattern 43 side.

The laminated substrate 111 has an output portion pattern 47 formed on the insulating substrate 40 and extending from the other short side of the insulating substrate 40 toward its central portion. In the central portion of the laminated substrate 111, the output portion pattern 47 is disposed so as to be sandwiched between the bifurcated portions of the negative electrode portion pattern 46. The output terminal pattern 49 is formed on an end portion of the output portion pattern 47 on the other short side of the insulating substrate 40. Consequently, the output portion pattern 47 and the output terminal pattern 49 are electrically connected to each other.

As illustrated in FIG. 3, near an end portion of the positive electrode portion pattern 44 opposite to the positive electrode side input terminal pattern 41 side, the semiconductor elements Sup11, Sup12 are mounted in a state of being electrically connected to the positive electrode portion pattern 44. Further, connecting members 51, 52 each in the form of, for example, a copper bar are disposed between the semiconductor elements Sup11, Sup12 and the output portion pattern 47. The connecting member 51 is electrically connected to the semiconductor element Sup11 and the output portion pattern 47, respectively. Consequently, the connecting member 51 is able to electrically connect the semiconductor element Sup11 and the output portion pattern 47 to each other. The connecting member 52 is electrically connected to the semiconductor element Sup12 and the output portion pattern 47, respectively. Consequently, the connecting member 52 is able to electrically connect the semiconductor element Sup12 and the output portion pattern 47 to each other.

Near an end portion of the positive electrode portion pattern 45 opposite to the positive electrode side input terminal pattern 42 side, the semiconductor elements Sup21, Sup22 are mounted in a state of being electrically connected to the positive electrode portion pattern 45. Further, connecting members 55, 56 each in the form of, for example, a copper bar are disposed between the semiconductor elements Sup21, Sup22 and the output portion pattern 47. The connecting member 55 is electrically connected to the semiconductor element Sup21 and the output portion pattern 47, respectively. Consequently, the connecting member 55 is able to electrically connect the semiconductor element Sup21 and the output portion pattern 47 to each other. The connecting member 56 is electrically connected to the semiconductor element Sup22 and the output portion pattern 47, respectively. Consequently, the connecting member 56 is able to electrically connect the semiconductor element Sup22 and the output portion pattern 47 to each other.

In a portion of the output portion pattern 47 disposed in the central portion of the laminated substrate 111, the semiconductor elements Slo11, Slo12, Slo21, Slo22 are mounted in a state of being electrically connected to the output portion pattern 47. Further, connecting members 53, 54, 57, 58 each in the form of, for example, a copper bar are disposed between the semiconductor elements Slo11, Slo12, Slo21, Slo22 and the negative electrode portion pattern 46.

The connecting member 53 is electrically connected to the semiconductor element Slo11 and the negative electrode portion pattern 46, respectively. Consequently, the connecting member 53 is able to electrically connect the semiconductor element Slo11 and the negative electrode portion pattern 46 to each other. The connecting member 54 is electrically connected to the semiconductor element Slo12 and the negative electrode portion pattern 46, respectively. Consequently, the connecting member 54 is able to electrically connect the semiconductor element Slo12 and the negative electrode portion pattern 46 to each other. The connecting member 57 is electrically connected to the semiconductor element Slo21 and the negative electrode portion pattern 46, respectively. Consequently, the connecting member 57 is able to electrically connect the semiconductor element Slo21 and the negative electrode portion pattern 46 to each other. The connecting member 58 is electrically connected to the semiconductor element Slo22 and the negative electrode portion pattern 46, respectively. Consequently, the connecting member 58 is able to electrically connect the semiconductor element Slo22 and the negative electrode portion pattern 46 to each other.

The positive electrode terminal 21$u$ (see FIG. 1) is electrically connected to and mounted on the positive electrode side input terminal pattern 41. The output terminal 81$u$ (see FIG. 1) is electrically connected to and mounted on the output terminal pattern 49. Therefore, the semiconductor element Sup11 and the semiconductor element Sup12 are connected in parallel between the positive electrode terminal 21u and the output terminal 81u via the positive electrode side input terminal pattern 41, the positive electrode portion pattern 44, the connecting members 51, 52, the output portion pattern 47, and the output terminal pattern 49.

The positive electrode terminal 21u (see FIG. 1) is electrically connected to and mounted on the positive electrode side input terminal pattern 42. Therefore, the semiconductor element Sup21 and the semiconductor element Sup22 are connected in parallel between the positive electrode terminal 21u and the output terminal 81u via the positive electrode side input terminal pattern 42, the positive electrode portion pattern 45, the connecting members 55, 56, the output portion pattern 47, and the output terminal pattern 49.

The negative electrode terminal 31u (see FIG. 1) is electrically connected to and mounted on the negative electrode side input terminal pattern 43. Therefore, the semiconductor element Slo11 and the semiconductor element Slo12 are connected in parallel between the output terminal 81u and the negative electrode terminal 31u via the output portion pattern 47, the output terminal pattern 49, the connecting members 53, 54, the negative electrode portion pattern 46, and the negative electrode side input terminal pattern 43. Further, the semiconductor element Slo21 and the semiconductor element Slo22 are connected in parallel between the output terminal 81u and the negative electrode terminal 31u via the output portion pattern 47, the output terminal pattern 49, the connecting members 57, 58, the negative electrode portion pattern 46, and the negative electrode side input terminal pattern 43. Consequently, the inverter circuit 112 has a half bridge circuit configuration.

Although the illustration is omitted, the laminated substrates 121, 131 also have the same configuration as the laminated substrate 111. Therefore, the inverter circuits 122, 132 each have a half bridge circuit configuration. In this way, the semiconductor module 1 is configured in a 6 in 1 module in which the U-phase inverter circuit 112 having the half bridge circuit configuration, the V-phase inverter circuit 122 having the half bridge circuit configuration, and the W-phase inverter circuit 132 having the half bridge circuit configuration are integrated into one module.

The positive electrode portion patterns 44, 45, the negative electrode portion pattern 46, and the output portion pattern 47 are formed adjacent to each other with a predetermined insulation distance provided therebetween so as to prevent a short circuit between them. Further, the positive electrode portion patterns 44, 45, the negative electrode portion pattern 46, and the output portion pattern 47 are entirely or partially sealed and fixed by the insulating mold resin (not illustrated) provided in the case 10 (see FIG. 1). Consequently, the insulation properties of the positive electrode portion patterns 44, 45, the negative electrode portion pattern 46, and the output portion pattern 47 are further improved.

The laminated substrate 111 is placed on the heat dissipation base or the cooler and thermally and mechanically joined to the heat dissipation base or the cooler by an under-substrate joining material (not illustrated). As described above, the case 10 is mechanically fixed to the heat dissipation base or the cooler. With this configuration, the semiconductor module 1 is able to dissipate the heat generated by the semiconductor elements Sup11, Sup12, Sup21, Sup22, Slo11, Slo12, Slo21, Slo22 to the heat dissipation base or the cooler via the laminated substrate 111 and the case 10. Consequently, the semiconductor module 1 is able to prevent damage to the semiconductor elements Sup11, Sup12, Sup21, Sup22, Slo11, Slo12, Slo21, Slo22 due to the heat generation.

Configurations of First Power Supply Terminal and Second Power Supply Terminal

Figure 4:
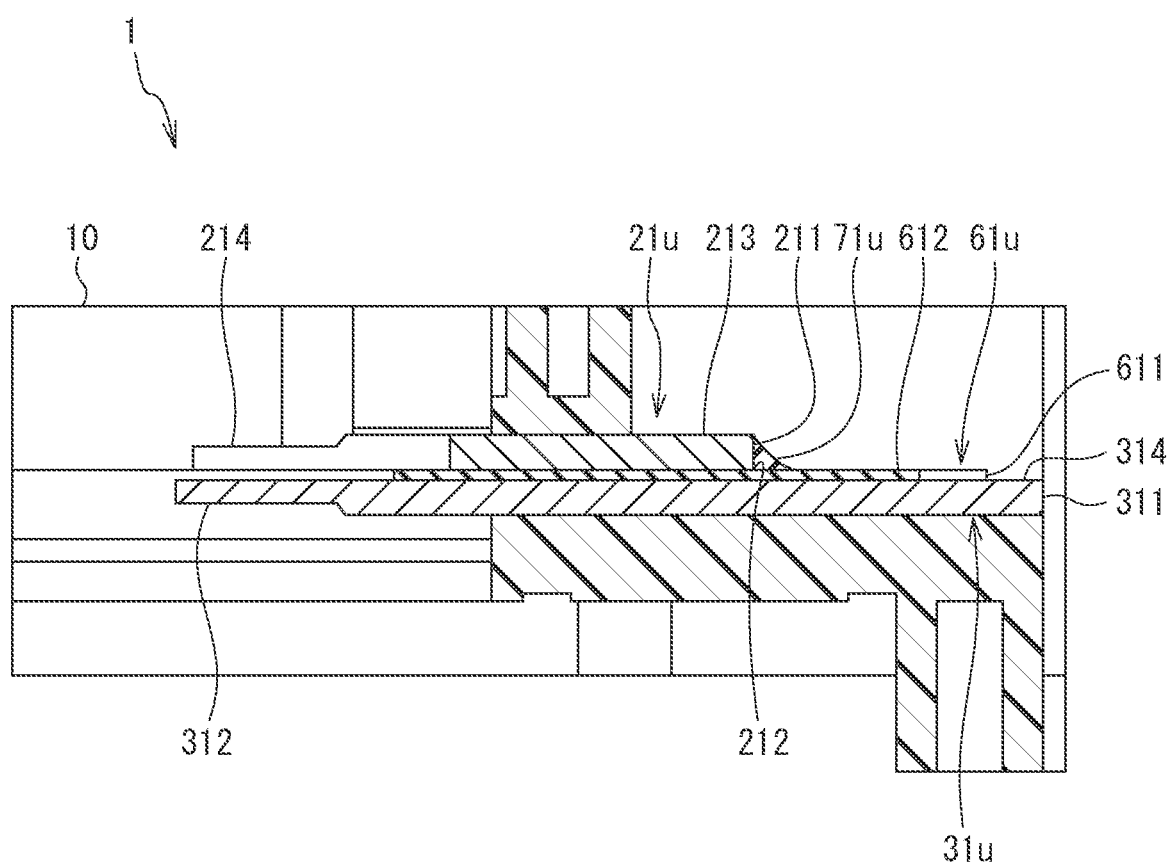
FIG. 4 is a diagram illustrating an example of power supply terminals provided in the semiconductor module according to the first embodiment of the present invention and is a sectional view taken along the line A-A in FIG. 1.

Next, the configurations of the negative electrode terminals 31u, 31v, 31w (examples of the first power supply terminals), the positive electrode terminals 21u, 21v, 21w (examples of the second power supply terminals), and the insulating sheets 61u, 61v, 61w provided in the semiconductor module 1 according to this embodiment will be described using FIGS. 4 and 5 while referring to FIGS. 1 to 3. In FIG. 4, the illustration of the laminated substrate 111 is omitted.

The negative electrode terminals 31u, 31v, 31w have the same configuration. Therefore, the configurations of the negative electrode terminals 31u, 31v, 31w will be described using the negative electrode terminal 31u as an example. The positive electrode terminals 21u, 21v, 21w have the same configuration. Therefore, the configurations of the positive electrode terminals 21u, 21v, 21w will be described using the positive electrode terminal 21u as an example. The insulating sheets 61u, 61v, 61w have the same configuration. Therefore, the configurations of the insulating sheets 61u, 61v, 61w will be described using the insulating sheet 61u as an example.

As illustrated in FIG. 4, the negative electrode terminal 31u, the insulating sheet 61u, and the positive electrode terminal 21u are provided in a laminated state in the case 10. The insulating sheet 61u is disposed so as to be sandwiched between the negative electrode terminal 31u and the positive electrode terminal 21u in a state of contacting the negative electrode terminal 31u and the positive electrode terminal 21u, respectively. Consequently, the electrical insulation at the negative electrode terminal 31u and the positive electrode terminal 21u is ensured by the insulating sheet 61u.

The negative electrode terminal 31u, the insulating sheet 61u, and the positive electrode terminal 21u are each disposed in a state of being partially exposed to the outside, and are each disposed in the housing portion 11 in a state where a part of the remaining portion is covered with the mold resin. A gap corresponding to the thickness of the insulating sheet 61u is provided between portions of the negative electrode terminal 31u and the positive electrode terminal 21u disposed on the housing portion 11 side. The mold resin is formed also in this gap so that the insulation of the negative electrode terminal 31u and the positive electrode terminal 21u is ensured.

As illustrated in FIG. 4, the negative electrode terminal 31u has a flat plate shape. The negative electrode terminal 31u has protruding portions 312, 313 formed on the side disposed in the housing portion 11. When the laminated substrate 111 is disposed in the housing portion 11, the protruding portions 312, 313 are disposed on the negative electrode side input terminal pattern 43 (see FIG. 1). The protruding portions 312, 313 are mechanically and electrically connected to the negative electrode side input terminal pattern 43, for example, by soldering. Consequently, the semiconductor elements Slo11, Slo12, Slo21, Slo22 are connected to the negative electrode side of the DC power via the negative electrode terminal 31u, the negative electrode side input terminal pattern 43, and the negative electrode portion pattern 46. In this embodiment, the two protruding portions 312, 313 are provided in order to facilitate the connection between the negative electrode terminal 31u and the laminated substrate 111, but alternatively, the number of protruding portions may be one.

The positive electrode terminal 21u has a flat plate shape. The positive electrode terminal 21u has protruding portions 214, 215 formed on the side disposed in the housing portion 11. The protruding portion 214 is mechanically and electrically connected to the positive electrode side input terminal pattern 41, for example, by soldering. The protruding portion 215 is mechanically and electrically connected to the positive electrode side input terminal pattern 42, for example, by soldering. Consequently, the semiconductor elements Sup11, Sup12, Sup21, Sup22 are connected to the positive electrode side of the DC power via the positive electrode terminal 21u, the positive electrode side input terminal patterns 41, 42, and the positive electrode portion patterns 44, 45.

The positive electrode terminal 21u is formed such that its length in a direction in which the protruding portions 214, 215 extend is shorter than the length of the negative electrode terminal 31u. Therefore, as illustrated in FIG. 1, when one end of the protruding portions 214, 215 and one end of the protruding portions 312, 313 are disposed to be approximately flush with each other, the one end 311 of the negative electrode terminal 31u is in a state of protruding to the one end portion side of the case 10 on the longitudinal side thereof more than the one end 211 of the positive electrode terminal 21u.

Referring back to FIG. 4, the insulating sheet 61u is disposed such that its one end 611 is located between the one end 211 of the positive electrode terminal 21u and the one end 311 of the negative electrode terminal 31u. Therefore, the insulating sheet 61u has the exposed portion 612 having a predetermined spread and being exposed to the outside between the one end 211 of the positive electrode terminal 21u and the one end 311 of the negative electrode terminal 31u. Consequently, the positive electrode terminal 21u, the insulating sheet 61u, and the negative electrode terminal 31u are disposed to be stacked stepwise at the one end portion of the case 10 on the longitudinal side thereof.

The positive electrode terminal 21u and the negative electrode terminal 31u are made of, for example, copper or a copper alloy. The positive electrode terminal 21u and the negative electrode terminal 31u each have a thickness of, for example, 0.6 mm or more and each may have a thickness of 0.8 mm or more and 1.2 mm or less. The insulating sheet 61u may be in the form of one sheet or a plurality of laminated sheets. The insulating sheet 61u has a thickness smaller than the thickness of each of the positive electrode terminal 21u and the negative electrode terminal 31u, for example. The insulating sheet 61u may have a thickness of, for example, 0.05 mm or more. The insulating sheet 61u may be made of, for example, aramid fiber, glass fiber, ceramic, polyimide, mica, or a composite material of one or more of these materials.

The positive electrode terminal 21u is made of a metal material such as copper and has an exposed portion 213 exposed to the outside. Therefore, the positive electrode terminal 21u can be electrically and mechanically connected to the positive electrode side of the DC power. Likewise, the negative electrode terminal 31u is made of a metal material such as copper and has the exposed portion 314 exposed to the outside. Therefore, the negative electrode terminal 31u can be electrically and mechanically connected to the negative electrode side of the DC power. The exposed portion 612 of the insulating sheet 61u is disposed between the exposed portion 213 of the positive electrode terminal 21u and the exposed portion 314 of the negative electrode terminal 31u. Therefore, the insulation distance between the exposed portion 213 of the positive electrode terminal 21u and the exposed portion 314 of the negative electrode terminal 31u is ensured by the exposed portion 612 of the insulating sheet 61u.

As illustrated in FIG. 4, the first dielectric portion 71u is formed to cover at least the corner 212 of the one end 211 of the positive electrode terminal 21u. The corner 212 is one of the corners of the one end 211, that is in contact with the insulating sheet 61u. In this embodiment, the first dielectric portion 71u is formed over a region exposed to the outside from the case 10 in the entire region of the one end 211, including the corner 212, and a part of the insulating sheet 61u (see FIGS. 1 and 4). The first dielectric portion 71u may be formed over from a part of the exposed portion 213 of the positive electrode terminal 21u to a part of the insulating sheet 61u as long as the first dielectric portion 71u is formed to cover the corner 212. Although the details will be described later, the first dielectric portion 71u has a relative permittivity higher than that of the insulating sheet 61u, for example. Assuming that the insulating sheet 61u has a relative permittivity of, for example, 3.2 to 3.8, the first dielectric portion 71u has a relative permittivity of 30 higher than 3.8, for example.

Herein, the actions and effects of the first dielectric portion 71u will be described. In the semiconductor module 1, in order to connect the positive electrode terminal 21u to the positive electrode side of the DC power, it is difficult to avoid the structure in which the exposed portion 213 of the positive electrode terminal 21u is disposed on the insulating sheet 61u. Therefore, the corner 212 of the one end 211 of the positive electrode terminal 21u becomes a triple point where the positive electrode terminal 21u being a conductor, and the insulating sheet 61u and the first dielectric portion 71u being two insulators with different relative permittivities intersect at one point. Even when the first dielectric portion 71u is not formed, the corner 212 of the one end 211 of the positive electrode terminal 21u becomes a triple point where the positive electrode terminal 21u being a conductor, and the insulating sheet 61u and the air being two insulators with different relative permittivities intersect at one point.

The triple point is a portion where the electric field is most prone to concentrate. Therefore, when positive electrode voltage of the DC power is applied to the positive electrode terminal 21u and negative electrode voltage of the DC power is applied to the negative electrode terminal 31u, the electric field generated from the one end 211 of the positive electrode terminal 21u toward the negative electrode terminal 31u side is prone to concentrate on the corner 212 of the one end 211 corresponding to the triple point.

When the insulating sheet 61u is formed by an insulating paper or the like so as to have microspaces inside, if the first dielectric portion 71u is not formed, the discharge is generated across the microspaces by electric field concentration on the corner 212, and there is a possibility that dielectric breakdown is caused by the progress of migration due to this discharge.

Assuming that the relative permittivities of two insulators are εr1 and εr2 (εr1<εr2) and that the angle formed by the insulator with the relative permittivity 6r1 and a metal conductor is smaller than 90 degrees, the electric field strength at a triple point becomes infinite so that there is a concern about the possibility of generation of the discharge at the triple point even at low voltage. The relative permittivity of the insulating sheet 61u is higher than that of the air. Therefore, when the one end 211 of the positive electrode terminal 21u is inclined toward the insulating sheet 61u due to the influence of machining accuracy of the positive electrode terminal 21u or the like, if the first dielectric portion 71u is not formed, the angle formed by the air with the low relative permittivity and the one end 211 becomes smaller than 90 degrees at the corner 212 of the one end 211 corresponding to the triple point. Therefore, when the first dielectric portion 71u is not formed, there is a concern about the possibility of generation of the discharge at the corner 212 of the one end 211 of the positive electrode terminal 21u.

TABLE 1

| | Relative Permittivity | | | | | | |
|---|---|---|---|---|---|---|---|
| | 1 | 10 | 15 | 20 | 25 | 30 | 35 |
| Electric Field Strength [MV/m] | 11.5 | 5.60 | 5.00 | 4.80 | 4.40 | 4.20 | 4.11 |
| Electric Field Relaxation Ratio [%] | 0 | 52 | 57 | 58 | 62 | 63 | 64 |

Table 1 is a table showing one example of simulation results of the electric field strength and the electric field relaxation ratio when the first dielectric portion 71u is formed to cover the corner 212 of the positive electrode terminal 21u. Table 1 shows the simulation results when the first dielectric portion 71u has the shape illustrated in FIG. 4, the surrounding environment of the semiconductor module 1 is the air, a voltage of 1200 V is applied to the positive electrode terminal 21u, and a voltage of 0 V is applied to the negative electrode terminal 31u. "Relative Permittivity" shown in Table 1 indicates the relative permittivity at the corner 212. "1" of "Relative Permittivity" corresponds to when the first dielectric portion 71u is not formed (i.e., the structure of a conventional semiconductor module), and the others correspond to when the first dielectric portion 71u is formed (i.e., the structure of the semiconductor module 1 according to this embodiment). "Electric Field Strength [MV/m]" shown in Table 1 indicates the electric field strength at the corner 212. "Electric Field Relaxation Ratio [%]" shown in Table 1 indicates the ratio by which the electric field strength is relaxed by the formation of the first dielectric portion 71u.

As shown in Table 1, when the first dielectric portion 71u is formed to cover the corner 212 of the positive electrode terminal 21u corresponding to the triple point (i.e., when the relative permittivity is from 10 to 35), the electric field strength is reduced and the electric field relaxation ratio is increased compared to when the first dielectric portion 71u is not formed. Further, as shown in Table 1, following an increase in the relative permittivity of the first dielectric portion 71u from 10 to 35, the electric field strength is monotonically reduced from 5.60 [MV/m] to 4.11 [MV/m], and the electric field relaxation ratio is monotonically increased from 52[%] to 64[%]. When the relative permittivity is 1, i.e., when the first dielectric portion 71u is not formed, the electric field strength is 11.5 [MV/m], and therefore, the electric field strength at the corner 212 of the positive electrode terminal 21u is reduced by the formation of the first dielectric portion 71u with the relative permittivity in the range from 10 to 35.

In Table 1, the minimum value of the relative permittivity of the first dielectric portion 71u is 10, but taking into account the properties that the electric field strength is reduced following the increase in relative permittivity, the first dielectric portion 71u may have a relative permittivity higher than that of the insulating sheet 61u. Consequently, the semiconductor module 1 is able to reduce the electric field strength and increase the electric field relaxation at the corner 212 of the positive electrode terminal 21u.

The relative permittivity of the first dielectric portion 71u can be adjusted by a forming material that forms the first dielectric portion 71u, for example. Therefore, in terms of selection of a material of the first dielectric portion 71u, the relative permittivity of the first dielectric portion 71u may be 30 or less. Consequently, the first dielectric portion 71u may have a relative permittivity higher than that of the insulating sheet 61u and equal to or less than 30 [F/m].

In this way, since the first dielectric portion 71u is provided, the semiconductor module 1 is able to relax the electric field concentration by shifting the electric field concentrating portion from the corner 212 corresponding to the triple point, thereby improving the reliability of the positive electrode terminal 21u and the negative electrode terminal 31u corresponding to the power supply terminals. Further, even when the insulating sheet 61u has microspaces inside, it is possible to suppress the generation of the discharge across the microspaces, and therefore, the semiconductor module 1 is able to improve the reliability of the positive electrode terminal 21u and the negative electrode terminal 31u.

Even when the one end 211 of the positive electrode terminal 21u is inclined toward the insulating sheet 61u, since the first dielectric portion 71u is formed to cover the corner 212, the insulator forming an angle smaller than 90 degrees with the one end 211 at the corner 212 of the one end 211 corresponding to the triple point is the first dielectric portion 71u. Since the relative permittivity of the first dielectric portion 71u is higher than that of the insulating sheet 61u, even when the angle formed by the one end 211 and the first dielectric portion 71u at the corner 212 is smaller than 90 degrees, the possibility of generation of the discharge becomes extremely low. Consequently, the semiconductor module 1 is able to improve the reliability of the positive electrode terminal 21u and the negative electrode terminal 31u.

Figure 5:
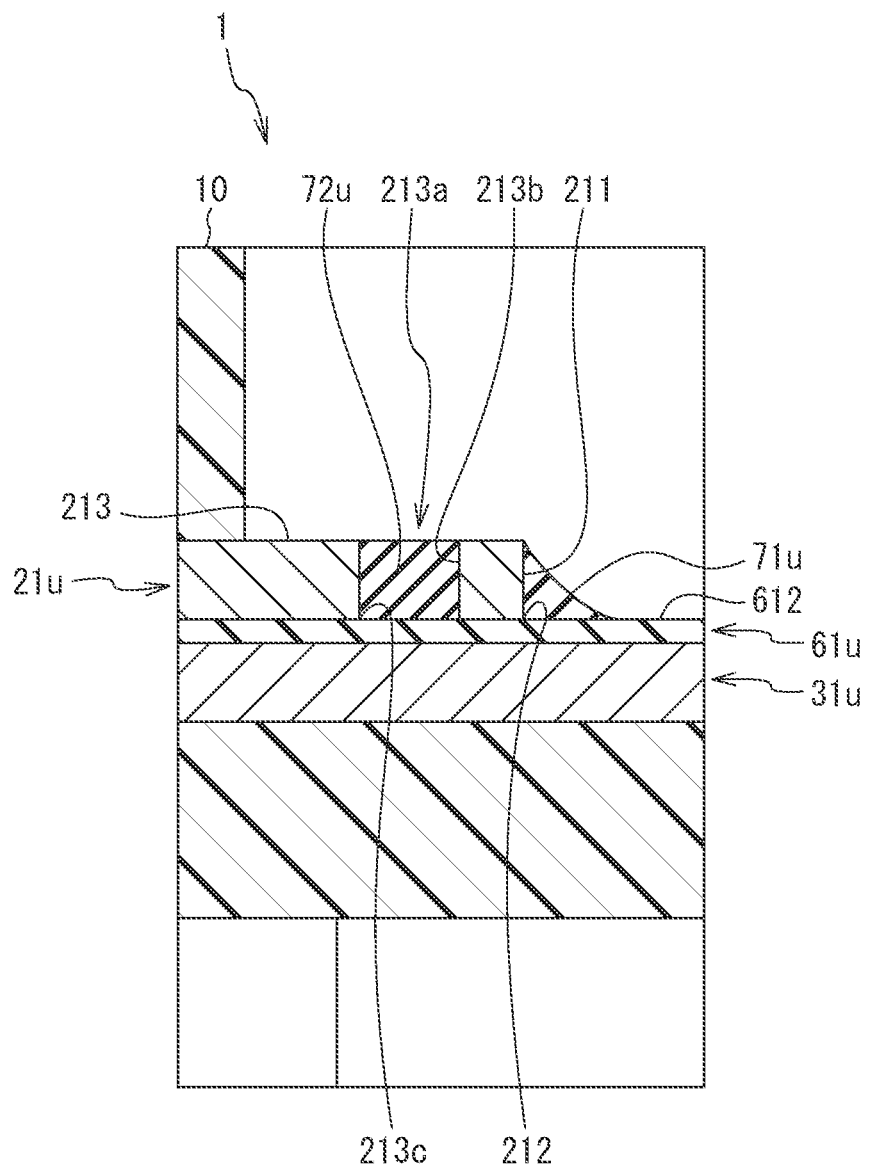
FIG. 5 is a diagram illustrating the example of the power supply terminals provided in the semiconductor module according to the first embodiment of the present invention and is a sectional view taken along the line B-B in FIG. 1.

As illustrated in FIG. 5, the positive electrode terminal 21u has a through-hole 213a formed through a part of the positive electrode terminal 21u so that the insulating sheet 61u is exposed, and the semiconductor module 1 includes a second dielectric portion 72u formed to cover at least an end portion 213c, on the insulating sheet 61u side, of an inner wall surface 213b forming the through-hole 213a. The second dielectric portion 72u has a relative permittivity higher than that of the insulating sheet 61u. As a dielectric material forming the second dielectric portion 72u, like the first dielectric portion 71u, titanium oxide or a titanate-based material may be used. As a specific titanate-based material, one or more of barium titanate, strontium titanate, calcium titanate, and magnesium titanate may be selected and used. The first dielectric portion 71u and the second dielectric portion 72u may be made of the same material or may be made of different materials. The number of the through-holes 213a is two, and the two through-holes 213a are formed in predetermined portions of the exposed portion 213 of the positive electrode terminal 21u (see FIG. 1). The through-holes 213a are used for positioning the positive electrode terminal 21u in the injection mold when insert-molding the case 10.

As illustrated in FIG. 5, the end portion 213c, on the insulating sheet 61u side, of the inner wall surface 213b forming the through-hole 213a becomes a triple point where the positive electrode terminal 21*u* being a conductor, and the insulating sheet 61*u* and the second dielectric portion 72*u* being two insulators with different relative permittivities intersect at one point. Therefore, when the second dielectric portion 72*u* is not formed in the through-hole 213*a*, since the positive electrode terminal 21*u*, the insulating sheet 61*u*, and the air in the through-hole 213*a* intersect at the end portion 213*c* of the inner wall surface 213*b*, there is a possibility of the occurrence of the above-described problem as in the case of the corner 212 of the one end 211 of the positive electrode terminal 21*u* when the first dielectric portion 71*u* is not provided.

In view of this, the semiconductor module 1 includes the second dielectric portion 72*u* formed in the through-hole 213*a* and having the relative permittivity higher than that of the insulating sheet 61*u*. Consequently, the second dielectric portion 72*u* is able to obtain the actions and effects with respect to the end portion 213*c* of the inner wall surface 213*b* that are similar to the above-described actions and effects of the first dielectric portion 71*u* with respect to the corner 212 of the one end 211 of the positive electrode terminal 21*u*. Therefore, the semiconductor module 1 is able to relax the electric field concentration by shifting the electric field concentrating portion from the end portion 213*c* corresponding to the triple point, thereby improving the reliability of the positive electrode terminal 21*u* and the negative electrode terminal 31*u*.

Although detailed description is omitted, the positive electrode terminal 21*v*, the insulating sheet 61*v*, the negative electrode terminal 31*v*, the first dielectric portion 71*v*, and a second dielectric portion 72*v* have the same configurations as the positive electrode terminal 21*u*, the insulating sheet 61*u*, the negative electrode terminal 31*u*, the first dielectric portion 71*u*, and the second dielectric portion 72*u*. Therefore, the semiconductor module 1 is able to improve the reliability of the positive electrode terminal 21*v* and the negative electrode terminal 31*v*. Further, the positive electrode terminal 21*w*, the insulating sheet 61*w*, the negative electrode terminal 31*w*, the first dielectric portion 71*w*, and a second dielectric portion 72*w* have the same configurations as the positive electrode terminal 21*u*, the insulating sheet 61*u*, the negative electrode terminal 31*u*, the first dielectric portion 71*u*, and the second dielectric portion 72*u*. Therefore, the semiconductor module 1 is able to improve the reliability of the positive electrode terminal 21*w* and the negative electrode terminal 31*w*.

As described above, the semiconductor module 1 according to this embodiment includes the negative electrode terminal 31*u*, 31*v*, 31*w* connected to the negative electrode side of the DC power; the positive electrode terminal 21*u*, 21*v*, 21*w* disposed above the negative electrode terminal 31*u*, 31*v*, 31*w* and connected to the positive electrode side of the DC power in the state where the exposed portion 314 of the negative electrode terminal 31*u*, 31*v*, 31*w* including the one end 311 of the negative electrode terminal 31*u*, 31*v*, 31*w* is exposed; the insulating sheet 61*u*, 61*v*, 61*w* disposed between the negative electrode terminal 31*u*, 31*v*, 31*w* and the positive electrode terminal 21*u*, 21*v*, 21*w* for insulation between the negative electrode terminal 31*u*, 31*v*, 31*w* and the positive electrode terminal 21*u*, 21*v*, 21*w* in the state where the exposed portion 612 of the insulating sheet 61*u*, 61*v*, 61*w* is exposed between the one end 311 of the negative electrode terminal 31*u*, 31*v*, 31*w* and the one end 211 of the positive electrode terminal 21*u*, 21*v*, 21*w*; and the first dielectric portion 71*u*, 71*v*, 71*w* formed to cover at least the corner 212 of the one end 211 of the positive electrode terminal 21*u*, 21*v*, 21*w*, the corner 212 being in contact with the insulating sheet 61*u*, 61*v*, 61*w*.

Consequently, the semiconductor module 1 is able to improve the insulation properties at the positive electrode terminals 21*u*, 21*v*, 21*w* and the negative electrode terminals 31*u*, 31*v*, 31*w* to which the electric power is supplied.

Second Embodiment

A semiconductor module according to a second embodiment of the present invention will be described with reference to FIGS. 6 to 8. First, the schematic configuration of the semiconductor module according to this embodiment will be described with reference to FIGS. 6 to 8. In this embodiment, a power conversion module capable of direct current-alternating current (DC-AC) conversion will be described as an example of the semiconductor module. In order to facilitate the understanding, the illustration of inverter circuits, wiring patterns, and so on mounted on laminated substrates provided in the semiconductor module according to this embodiment is omitted in FIG. 6. In the description of the semiconductor module according to this embodiment, the same signs are given to constituent elements that exhibit the same actions and functions as in the semiconductor module 1 according to the first embodiment, and a description thereof is omitted.

Figure 6:
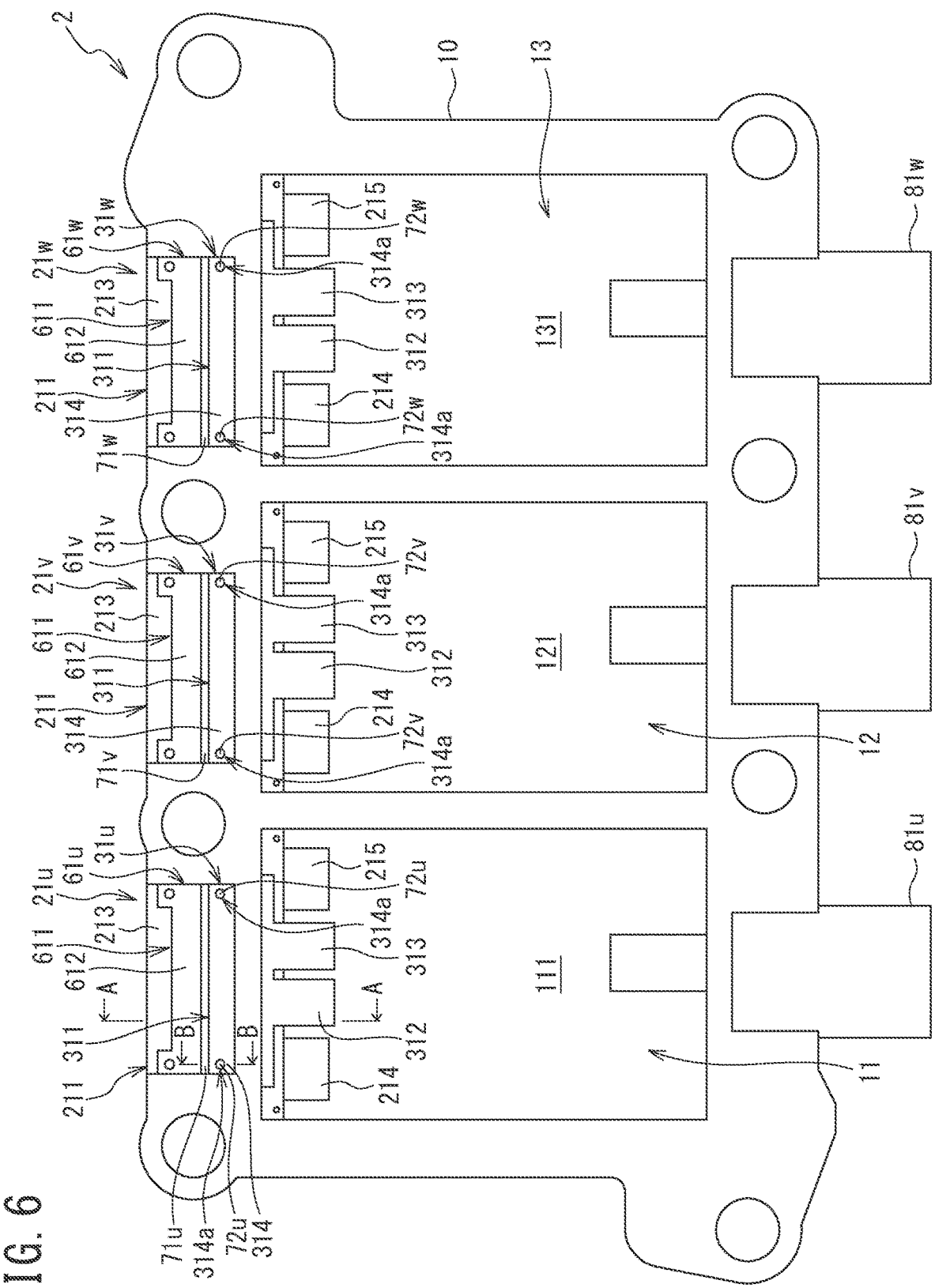
FIG. 6 is a plan view illustrating a schematic configuration of a semiconductor module according to a second embodiment of the present invention.
Figure 7:
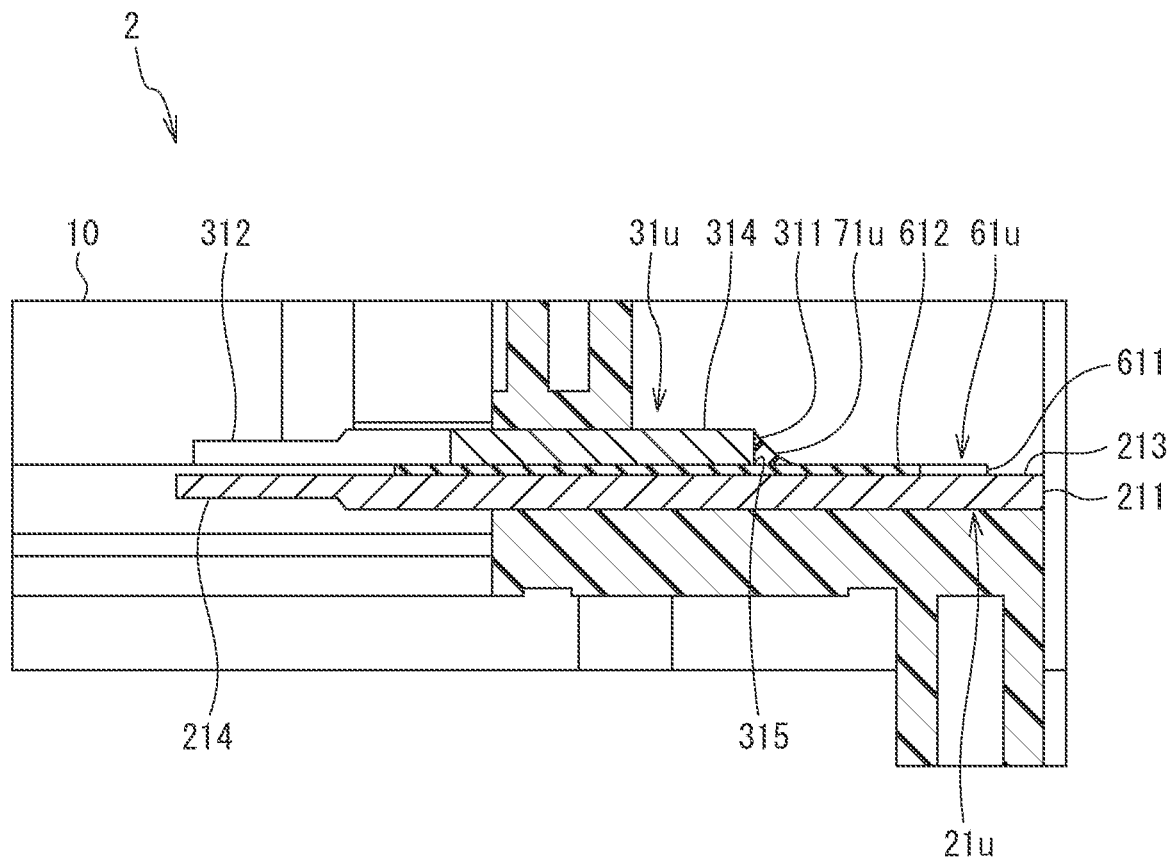
FIG. 7 is a diagram illustrating an example of power supply terminals provided in the semiconductor module according to the second embodiment of the present invention and is a sectional view taken along the line A-A in FIG. 6.

As illustrated in FIG. 6, a semiconductor module 2 according to this embodiment includes a U-phase positive electrode terminal 21*u* (one example of a first power supply terminal) connected to a first polarity side of DC power. Further, the semiconductor module 2 includes a negative electrode terminal 31*u* (one example of a second power supply terminal) disposed above the positive electrode terminal 21*u* and connected to a second polarity side of the DC power in a state where an exposed portion 213 of the positive electrode terminal 21*u* (one example of a part of the first power supply terminal) including one end 211 of the positive electrode terminal 21*u* is exposed. In this embodiment, the first polarity side connected to the positive electrode terminal 21*u* is the positive electrode side of the DC power, and the second polarity side connected to the negative electrode terminal 31*u* is the negative electrode side of the DC power. The positive electrode terminal 21*u* and the negative electrode terminal 31*u* are provided on one of both sides of a housing portion 11 at one end portion of a case 10 on the longitudinal side thereof.

Further, the semiconductor module 2 includes an insulating sheet 61*u* disposed between the positive electrode terminal 21*u* and the negative electrode terminal 31*u* for insulation between the positive electrode terminal 21*u* and the negative electrode terminal 31*u* in a state where an exposed portion 612 of the insulating sheet 61*u* (one example of a part of the insulating sheet) is exposed between the one end 211 of the positive electrode terminal 21*u* and one end 311 of the negative electrode terminal 31*u*. Further, the semiconductor module 2 includes a first dielectric portion 71*u* formed to cover at least a corner 315 (not illustrated in FIG. 6, see FIG. 7) of the one end 311 of the negative electrode terminal 31*u*, the corner 315 being in contact with the insulating sheet 61*u*.

The semiconductor module 2 includes a V-phase positive electrode terminal 21*v* (one example of a first power supply terminal) connected to a first polarity side of DC power. Further, the semiconductor module 2 includes a negative electrode terminal 31*v* (one example of a second power supply terminal) disposed above the positive electrode terminal 21*v* and connected to a second polarity side of the DC power in a state where an exposed portion 213 of the positive electrode terminal 21v (one example of a part of the first power supply terminal) including one end 211 of the positive electrode terminal 21v is exposed. In this embodiment, the first polarity side connected to the positive electrode terminal 21v is the positive electrode side of the DC power, and the second polarity side connected to the negative electrode terminal 31v is the negative electrode side of the DC power. The positive electrode terminal 21v and the negative electrode terminal 31v are provided on one of both sides of a housing portion 12 at one end portion of the case 10 on the longitudinal side thereof.

Further, the semiconductor module 2 includes an insulating sheet 61v disposed between the positive electrode terminal 21v and the negative electrode terminal 31v for insulation between the positive electrode terminal 21v and the negative electrode terminal 31v in a state where an exposed portion 612 of the insulating sheet 61v (one example of a part of the insulating sheet) is exposed between the one end 211 of the positive electrode terminal 21v and one end 311 of the negative electrode terminal 31v. Further, the semiconductor module 2 includes a first dielectric portion 71v formed to cover at least a corner (not illustrated) of the one end 311 of the negative electrode terminal 31v, the corner being in contact with the insulating sheet 61v. The corner of the one end 311 of the negative electrode terminal 31v corresponds to the corner 315 in the negative electrode terminal 31u.

The semiconductor module 2 includes a W-phase positive electrode terminal 21w (one example of a first power supply terminal) connected to a first polarity side of DC power. Further, the semiconductor module 2 includes a negative electrode terminal 31w (one example of a second power supply terminal) disposed above the positive electrode terminal 21w and connected to a second polarity side of the DC power in a state where an exposed portion 213 of the positive electrode terminal 21w (one example of a part of the first power supply terminal) including one end 211 of the positive electrode terminal 21w is exposed. In this embodiment, the first polarity side connected to the positive electrode terminal 21w is the positive electrode side of the DC power, and the second polarity side connected to the negative electrode terminal 31w is the negative electrode side of the DC power. The positive electrode terminal 21w and the negative electrode terminal 31w are provided on one of both sides of a housing portion 13 at one end portion of the case 10 on the longitudinal side thereof.

Further, the semiconductor module 2 includes an insulating sheet 61w disposed between the positive electrode terminal 21w and the negative electrode terminal 31w for insulation between the positive electrode terminal 21w and the negative electrode terminal 31w in a state where an exposed portion 612 of the insulating sheet 61w (one example of a part of the insulating sheet) is exposed between the one end 211 of the positive electrode terminal 21w and one end 311 of the negative electrode terminal 31w. Further, the semiconductor module 2 includes a first dielectric portion 71w formed to cover at least a corner (not illustrated) of the one end 311 of the negative electrode terminal 31w, the corner being in contact with the insulating sheet 61w. The corner of the one end 311 of the negative electrode terminal 31w corresponds to the corner 315 in the negative electrode terminal 31u.

Since laminated substrates 111, 121, 131 in this embodiment have the same configuration as the laminated substrates 111, 121, 131 in the first embodiment, a description thereof is omitted.

Configurations of First Power Supply Terminal and Second Power Supply Terminal

Next, the configurations of the positive electrode terminals 21u, 21v, 21w (examples of the first power supply terminals), the negative electrode terminals 31u, 31v, 31w (examples of the second power supply terminals), and the insulating sheets 61u, 61v, 61w provided in the semiconductor module 2 according to this embodiment will be described using FIGS. 7 and 8 while referring to FIG. 6. In FIG. 7, the illustration of the laminated substrate 111 is omitted.

The positive electrode terminal 21u in this embodiment is configured such that, in order to connect its protruding portions 214, 215, from below the insulating sheet 61u, to positive electrode side input terminal patterns 41, 42 (see FIG. 3) provided in the laminated substrate 111, the shape of the positive electrode terminal 21u on the protruding portion 214, 215 side is partially different from the shape of the positive electrode terminal 21u in the first embodiment. Further, the negative electrode terminal 31u in this embodiment is configured such that, in order to connect its protruding portions 312, 313, from above the insulating sheet 61u, to a negative electrode side input terminal pattern 43 (see FIG. 3) provided in the laminated substrate 111, the shape of the negative electrode terminal 31u on the protruding portion 312, 313 side is partially different from the shape of the negative electrode terminal 31u in the first embodiment.

The positive electrode terminal 21v in this embodiment is configured such that, in order to connect its protruding portions 214, 215, from below the insulating sheet 61v, to positive electrode side input terminal patterns 41, 42 (not illustrated, see FIG. 3) provided in the laminated substrate 121, the shape of the positive electrode terminal 21v on the protruding portion 214, 215 side is partially different from the shape of the positive electrode terminal 21v in the first embodiment. Further, the negative electrode terminal 31v in this embodiment is configured such that, in order to connect its protruding portions 312, 313, from above the insulating sheet 61v, to a negative electrode side input terminal pattern 43 (not illustrated, see FIG. 3) provided in the laminated substrate 121, the shape of the negative electrode terminal 31v on the protruding portion 312, 313 side is partially different from the shape of the negative electrode terminal 31v in the first embodiment.

The positive electrode terminal 21w in this embodiment is configured such that, in order to connect its protruding portions 214, 215, from below the insulating sheet 61w, to positive electrode side input terminal patterns 41, 42 (not illustrated, see FIG. 3) provided in the laminated substrate 131, the shape of the positive electrode terminal 21w on the protruding portion 214, 215 side is partially different from the shape of the positive electrode terminal 21w in the first embodiment. Further, the negative electrode terminal 31w in this embodiment is configured such that, in order to connect its protruding portions 312, 313, from above the insulating sheet 61w, to a negative electrode side input terminal pattern 43 (not illustrated, see FIG. 3) provided in the laminated substrate 131, the shape of the negative electrode terminal 31w on the protruding portion 312, 313 side is partially different from the shape of the negative electrode terminal 31w in the first embodiment.

In the semiconductor module 2, differently from the semiconductor module 1 according to the first embodiment, the negative electrode terminal 31u is disposed on the insulating sheet 61u. Therefore, in the semiconductor module 2, in order to connect the negative electrode terminal 31u to the negative electrode side of the DC power, it is difficult to avoid the structure in which an exposed portion 314 of the negative electrode terminal 31u is disposed on the insulating sheet 61u. Consequently, as illustrated in FIG. 7, the corner 315 of the one end 311 of the negative electrode terminal 31u becomes a triple point where the negative electrode terminal 31u being a conductor, and the insulating sheet 61u and the first dielectric portion 71u being two insulators with different relative permittivities intersect at one point. Even when the first dielectric portion 71u is not formed, the corner 315 of the one end 311 of the negative electrode terminal 31u becomes a triple point where the negative electrode terminal 31u being a conductor, and the insulating sheet 61u and the air being two insulators with different relative permittivities intersect at one point.

TABLE 2

| | Relative Permittivity | | | | | | |
|---|---|---|---|---|---|---|---|
| | 1 | 10 | 15 | 20 | 25 | 30 | 35 |
| Electric Field Strength [MV/m] | 11.5 | 5.90 | 5.20 | 4.60 | 4.50 | 4.30 | 4.30 |
| Electric Field Relaxation Ratio [%] | 0 | 49 | 55 | 60 | 61 | 63 | 63 |

Table 2 is a table showing one example of simulation results of the electric field strength and the electric field relaxation ratio when the first dielectric portion 71u is formed to cover the corner 315 of the negative electrode terminal 31u. Table 2 shows the simulation results when the surrounding environment of the semiconductor module 2 is the air, the first dielectric portion 71u has a shape illustrated in FIG. 7, a voltage of 1200 V is applied to the positive electrode terminal 21u, and a voltage of 0 V is applied to the negative electrode terminal 31u. The shape of the first dielectric portion 71u in this simulation is a shape formed over a part of the entire region of the one end 311, including the corner 315 and exposed to the outside from the case 10, and a part of the insulating sheet 61u. Since the items shown in Table 2 are the same as the items shown in Table 1, a description thereof is omitted.

As shown in Table 2, when the first dielectric portion 71u is formed to cover the corner 315 of the negative electrode terminal 31u corresponding to the triple point (i.e., when the relative permittivity is from 10 to 35), the electric field strength is reduced and the electric field relaxation ratio is increased compared to when the first dielectric portion 71u is not formed. Further, as shown in Table 2, when the relative permittivity of the first dielectric portion 71u is from 10 to 30, following an increase in the relative permittivity of the first dielectric portion 71u from 10 to 30, the electric field strength is monotonically reduced from 5.90 [MV/m] to 4.30 [MV/m], and the electric field relaxation ratio is monotonically increased from 49[%] to 63[%]. In Table 2, the minimum value of the relative permittivity of the first dielectric portion 71u is 10, but taking into account the properties that the electric field strength is reduced following the increase in relative permittivity, the first dielectric portion 71u may have a relative permittivity higher than that of the insulating sheet 61u. Consequently, the semiconductor module 2 is able to reduce the electric field strength and increase the electric field relaxation at the corner 315 of the negative electrode terminal 31u.

When the relative permittivity of the first dielectric portion 71u becomes 30 or more, the electric field strength is saturated at 4.30 [MV/m] and the electric field relaxation ratio is saturated at 63[%]. The relative permittivity of the first dielectric portion 71u can be adjusted by a forming material that forms the first dielectric portion 71u, for example. Therefore, in terms of selection of a material of the first dielectric portion 71u, the relative permittivity of the first dielectric portion 71u may be 30 or less. Consequently, the first dielectric portion 71u may have a relative permittivity higher than that of the insulating sheet 61u and equal to or less than 30 [F/m].

In this way, even with the structure in which the negative electrode terminal 31u is disposed on the insulating sheet 61u, the same actions and effects as with the structure in which the positive electrode terminal 21u is disposed on the insulating sheet 61u are obtained. That is, by including the first dielectric portion 71u, the semiconductor module 2 is able to obtain the same actions and effects as the semiconductor module 1 according to the first embodiment.

Figure 8:
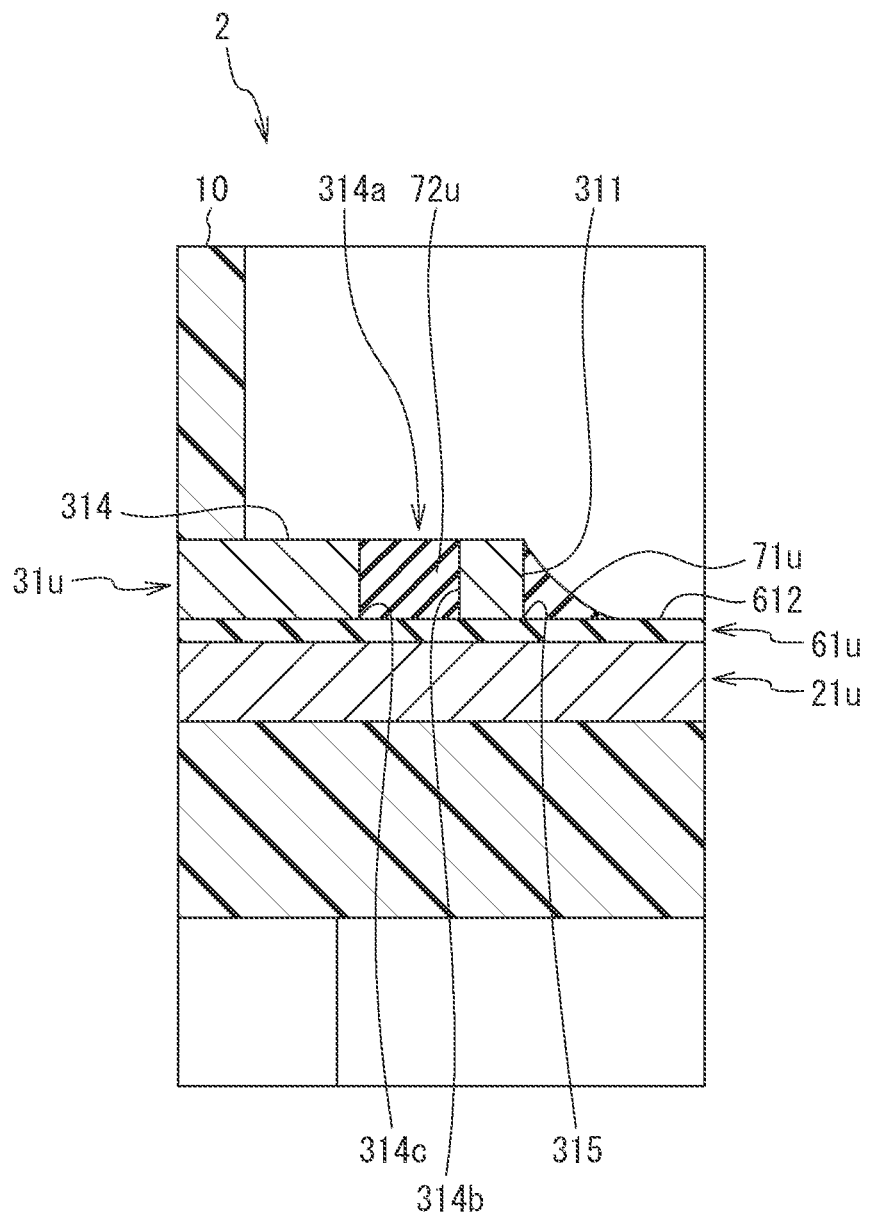
FIG. 8 is a diagram illustrating the example of the power supply terminals provided in the semiconductor module according to the second embodiment of the present invention and is a sectional view taken along the line B-B in FIG. 6.

As illustrated in FIG. 8, the negative electrode terminal 31u includes a through-hole 314a formed through a part of the negative electrode terminal 31u so that the insulating sheet 61u is exposed, and the semiconductor module 2 includes a second dielectric portion 72u formed to cover at least an end portion 314c, on the insulating sheet 61u side, of an inner wall surface 314b forming the through-hole 314a. The second dielectric portion 72u has a relative permittivity higher than that of the insulating sheet 61u. The number of the through-holes 314a is two, and the two through-holes 314a are formed in predetermined portions of the exposed portion 314 of the negative electrode terminal 31u (see FIG. 6). The through-holes 314a are used for positioning the negative electrode terminal 31u in the injection mold when insert-molding the case 10.

As illustrated in FIG. 8, the end portion 314c, on the insulating sheet 61u side, of the inner wall surface 314b forming the through-hole 314a becomes a triple point where the negative electrode terminal 31u being a conductor, and the insulating sheet 61u and the second dielectric portion 72u being two insulators with different relative permittivities intersect at one point. Therefore, when the second dielectric portion 72u is not formed in the through-hole 314a, since the negative electrode terminal 31u, the insulating sheet 61u, and the air in the through-hole 314a intersect at the end portion 314c of the inner wall surface 314b, there is a possibility of the occurrence of the above-described problem as in the case of the corner 315 of the one end 311 of the negative electrode terminal 31u when the first dielectric portion 71u is not provided.

However, the semiconductor module 2 includes the second dielectric portion 72u formed in the through-hole 314a and having the relative permittivity higher than that of the insulating sheet 61u. Consequently, the second dielectric portion 72u is able to obtain the actions and effects with respect to the end portion 314c of the inner wall surface 314b that are similar to the above-described actions and effects of the first dielectric portion 71u with respect to the corner 315 of the one end 311 of the negative electrode terminal 31u. Therefore, the semiconductor module 2 is able to relax the electric field concentration by shifting the electric field concentrating portion from the end portion 314c corresponding to the triple point, thereby improving the reliability of the positive electrode terminal 21u and the negative electrode terminal 31u.

Although detailed description is omitted, the positive electrode terminal 21v, the insulating sheet 61v, the negative electrode terminal 31v, the first dielectric portion 71v, and a second dielectric portion 72v have the same configurations as the positive electrode terminal 21u, the insulating sheet 61u, the negative electrode terminal 31u, the first dielectric portion 71u, and the second dielectric portion 72u. Therefore, the semiconductor module 2 is able to improve the reliability of the positive electrode terminal 21v and the negative electrode terminal 31v. Further, the positive electrode terminal 21w, the insulating sheet 61w, the negative electrode terminal 31w, the first dielectric portion 71w, and a second dielectric portion 72w have the same configurations as the positive electrode terminal 21u, the insulating sheet 61u, the negative electrode terminal 31u, the first dielectric portion 71u, and the second dielectric portion 72u. Therefore, the semiconductor module 2 is able to improve the reliability of the positive electrode terminal 21w and the negative electrode terminal 31w.

As described above, the semiconductor module 2 according to this embodiment includes the positive electrode terminal 21u, 21v, 21w connected to the positive electrode side of the DC power; the negative electrode terminal 31u, 31v, 31w disposed above the positive electrode terminal 21u, 21v, 21w and connected to the negative electrode side of the DC power in the state where the exposed portion 213 of the positive electrode terminal 21u, 21v, 21w including the one end 211 of the positive electrode terminal 21u, 21v, 21w is exposed; the insulating sheet 61u, 61v, 61w disposed between the positive electrode terminal 21u, 21v, 21w and the negative electrode terminal 31u, 31v, 31w for insulation between the positive electrode terminal 21u, 21v, 21w and the negative electrode terminal 31u, 31v, 31w in the state where the exposed portion 612 of the insulating sheet 61u, 61v, 61w is exposed between the one end 211 of the positive electrode terminal 21u, 21v, 21w and the one end 311 of the negative electrode terminal 31u, 31v, 31w; and the first dielectric portion 71u, 71v, 71w formed to cover at least the corner 315 of the one end 311 of the negative electrode terminal 31u, 31v, 31w, the corner 315 being in contact with the insulating sheet 61u, 61v, 61w.

Consequently, the semiconductor module 2 is able to improve the insulation properties at the positive electrode terminals 21u, 21v, 21w and the negative electrode terminals 31u, 31v, 31w to which the electric power is supplied.

The present invention is not limited to the above-described embodiments, but can be modified in various ways.

In the above-described first and second embodiments, the transistor provided in the semiconductor element is the wide bandgap semiconductor element, but it may be an insulated-gate bipolar transistor (IGBT).

The technical scope of the present invention is not limited to the exemplary embodiments illustrated and described, but also includes all embodiments that provide advantageous effects equivalent to those aimed at by the present invention. Further, the technical scope of the present invention is not limited to a combination of features of the present invention defined by the claims, but can be defined by any desired combination of specific features among all disclosed respective features.

REFERENCE SIGNS LIST 1, 2 semiconductor module
10 case
11, 12, 13 housing portion
21u, 21v, 21w positive electrode terminal
31u, 31v, 31w negative electrode terminal
40 insulating substrate
41, 42 positive electrode side input terminal pattern
43 negative electrode side input terminal pattern
44, 45 positive electrode portion pattern
46 negative electrode portion pattern
47 output portion pattern
49 output terminal pattern
51, 52, 53, 54, 55, 56, 57, 58 connecting member
61u, 61v, 61w insulating sheet
71u, 71v, 71w first dielectric portion
72u, 72v, 72w second dielectric portion
81u, 81v, 81w output terminal
111, 121, 131 laminated substrate
112, 122, 132 inverter circuit
211, 311, 611 one end
212, 315 corner
213, 314, 612 exposed portion
213a, 314a through-hole
213b, 314b inner wall surface
213c, 314c end portion
214, 215, 312, 313 protruding portion

The invention claimed is:

1. A semiconductor module comprising:
a first power supply terminal connected to a first polarity side of direct current power;
a second power supply terminal disposed above the first power supply terminal and connected to a second polarity side of the direct current power in a state where a part of the first power supply terminal including one end of the first power supply terminal is exposed;
an insulating sheet disposed between the first power supply terminal and the second power supply terminal for insulation between the first power supply terminal and the second power supply terminal in a state where a part of the insulating sheet is exposed between the one end of the first power supply terminal and one end of the second power supply terminal; and
a first dielectric portion formed to cover at least a corner of the one end of the second power supply terminal, the corner being in contact with the insulating sheet.

2. The semiconductor module according to claim 1, wherein the first dielectric portion has a relative permittivity higher than a relative permittivity of the insulating sheet.

3. The semiconductor module according to claim 1, wherein:
the second power supply terminal has a through-hole formed through a part of the second power supply terminal to allow the insulating sheet to be exposed; and
the semiconductor module includes a second dielectric portion formed to cover at least an end portion, on a side of the insulating sheet, of an inner wall surface forming the through-hole.

4. The semiconductor module according to claim 3, wherein the second dielectric portion has a relative permittivity higher than a relative permittivity of the insulating sheet.

5. The semiconductor module according to claim 1, wherein the first polarity side is a negative electrode side of the direct current power and the second polarity side is a positive electrode side of the direct current power, or the first polarity side is a positive electrode side of the direct current power and the second polarity side is a negative electrode side of the direct current power.

6. The semiconductor module according to claim 1, wherein:

the second power supply terminal has a through-hole formed through a part of the second power supply terminal to allow the insulating sheet to be exposed; and the semiconductor module includes a second dielectric portion formed to cover at least an end portion, on a side of the insulating sheet, of an inner wall surface forming the through-hole.

7. The semiconductor module according to claim 2, wherein the first polarity side is a negative electrode side of the direct current power and the second polarity side is a positive electrode side of the direct current power, or the first polarity side is a positive electrode side of the direct current power and the second polarity side is a negative electrode side of the direct current power.

8. The semiconductor module according to claim 3, wherein the first polarity side is a negative electrode side of the direct current power and the second polarity side is a positive electrode side of the direct current power, or the first polarity side is a positive electrode side of the direct current power and the second polarity side is a negative electrode side of the direct current power.

9. The semiconductor module according to claim 4, wherein the first polarity side is a negative electrode side of the direct current power and the second polarity side is a positive electrode side of the direct current power, or the first polarity side is a positive electrode side of the direct current power and the second polarity side is a negative electrode side of the direct current power.

\* \* \* \* \*